(12) United States Patent
Hu

(10) Patent No.: US 12,199,027 B2
(45) Date of Patent: Jan. 14, 2025

(54) SUBSTRATE AND MANUFACTURING METHOD THEREOF

(71) Applicant: Dyi-Chung Hu, Hsinchu County (TW)

(72) Inventor: Dyi-Chung Hu, Hsinchu County (TW)

( * ) Notice: Subject to any disclaimer, the term of this patent is extended or adjusted under 35 U.S.C. 154(b) by 0 days.

(21) Appl. No.: 18/809,280

(22) Filed: Aug. 19, 2024

(65) Prior Publication Data

US 2024/0413072 A1   Dec. 12, 2024

Related U.S. Application Data

(63) Continuation-in-part of application No. 18/432,090, filed on Feb. 5, 2024, now Pat. No. 12,100,632.

(Continued)

(30) Foreign Application Priority Data

Dec. 29, 2023   (TW) .................................. 112151496

(51) Int. Cl.
| | |
|---|---|
| *H01L 23/15* | (2006.01) |
| *B32B 3/26* | (2006.01) |
| *B32B 17/10* | (2006.01) |
| *B32B 38/00* | (2006.01) |
| *H01L 23/48* | (2006.01) |
| *H01L 23/498* | (2006.01) |

(Continued)

(52) U.S. Cl.
CPC ........ *H01L 23/49861* (2013.01); *B32B 3/266* (2013.01); *B32B 17/10* (2013.01); *B32B 38/0012* (2013.01); *H01L 23/481* (2013.01); *H01L 23/49838* (2013.01); *H05K 1/0306* (2013.01); *B32B 2307/202* (2013.01); *B32B 2307/7376* (2023.05); *B32B 2310/0843* (2013.01); *H01L 23/3121* (2013.01); *H01L 23/49811* (2013.01); *H01L 24/16* (2013.01); *H01L 2224/16225* (2013.01); *H01L 2924/152* (2013.01)

(58) Field of Classification Search
CPC .............................. H01L 23/15; H01L 21/486
See application file for complete search history.

(56) References Cited

U.S. PATENT DOCUMENTS

2011/0147059 A1 *  6/2011  Ma .......................... H01L 24/73
                                                              156/60

FOREIGN PATENT DOCUMENTS

TW             202240804          10/2022

OTHER PUBLICATIONS

"Office Action of Taiwan Counterpart Application", issued on Sep. 30, 2024, p. 1-p. 7.

* cited by examiner

*Primary Examiner* — Sherman Ng
(74) *Attorney, Agent, or Firm* — JCIPRNET

(57) ABSTRACT

A glass core substrate includes a first glass layer; a second glass layer disposed on the first glass layer; a third glass layer disposed on the second glass layer; a first bonding layer disposed between the first glass layer and the second glass layer; a second bonding layer disposed between the second glass layer and the third glass layer; and a conductive connector, passing through the first glass layer, the first bonding layer, the second glass layer, the second bonding layer, and the third glass layer, wherein the conductive connector is configured to provide a vertical conductive path penetrating through the first glass layer, the first bonding layer, the second glass layer, the second bonding layer, and the third glass layer. A manufacturing method of a glass core substrate is also provided.

15 Claims, 27 Drawing Sheets

Related U.S. Application Data

(60) Provisional application No. 63/640,210, filed on Apr. 30, 2024, provisional application No. 63/634,895, filed on Apr. 16, 2024, provisional application No. 63/589,964, filed on Oct. 12, 2023, provisional application No. 63/542,090, filed on Oct. 3, 2023, provisional application No. 63/444,566, filed on Feb. 10, 2023.

(51) Int. Cl.
*H05K 1/03* (2006.01)
*H01L 23/00* (2006.01)
*H01L 23/31* (2006.01)

SUBSTRATE AND MANUFACTURING METHOD THEREOF

CROSS-REFERENCE TO RELATED APPLICATION

This application is a continuation-in-part application of and claims the priority benefit of a prior application Ser. No. 18/432,090, filed on Feb. 5, 2024. The prior application Ser. No. 18/432,090 claims the priority benefit of U.S. provisional application Ser. No. 63/444,566, filed on Feb. 10, 2023, U.S. provisional application Ser. No. 63/542,090, filed on Oct. 3, 2023, U.S. provisional application Ser. No. 63/589,964, filed on Oct. 12, 2023 and Taiwan application serial no. 112151496, filed on Dec. 29, 2023. This application also claims the priority benefit of U.S. provisional application Ser. No. 63/640,210, filed on Apr. 30, 2024 and U.S. provisional application Ser. No. 63/634,895, filed on Apr. 16, 2024. The entirety of each of the above-mentioned patent applications is hereby incorporated by reference herein and made a part of this specification.

BACKGROUND

Technical Field

This disclosure relates to a substrate and a manufacturing method of the substrate.

Description of Related Art

Current glass core substrates are often composed of glass fiber and epoxy resin materials. However, with the increasing requirements for the reliability of the glass core substrates, the glass core substrates are no longer sufficient.

SUMMARY

This disclosure provides a substrate and a manufacturing method thereof, which can improve reliability of a subsequent product.

A glass core substrate includes a first glass layer; a second glass layer disposed on the first glass layer; a third glass layer disposed on the second glass layer; a first bonding layer disposed between the first glass layer and the second glass layer; a second bonding layer disposed between the second glass layer and the third glass layer; and a conductive connector, passing through the first glass layer, the first bonding layer, the second glass layer, the second bonding layer, and the third glass layer, wherein the conductive connector is configured to provide a vertical conductive path penetrating through the first glass layer, the first bonding layer, the second glass layer, the second bonding layer, and the third glass layer.

A manufacturing method of a glass core substrate includes: providing a first glass layer, a second glass layer, and a third glass layer; performing bonding process to bond the first glass layer and the second glass layer through a first bonding layer and bond the second glass layer and the third glass layer through a second bonding layer; and removing portions of the first glass layer, the second glass layer, the third glass layer, the first bonding layer, and the second bonding layer to form conductive connector.

Based on the above, in this disclosure, the bonding layer is used as a crack-stopping structure through the design of the stacked glass layers (especially three glass layers). In this way, the phenomenon of rapid propagation of brittle cracks from the edge to the center of the substrate can be reduced, effectively inhibiting the propagation of cracks, thereby improving the reliability of a subsequent product.

In order for the features and advantages of the disclosure to be more comprehensible, the following specific embodiments are described in detail in conjunction with the drawings.

DETAILED DESCRIPTION OF DISCLOSED EMBODIMENTS

Figure 1A:
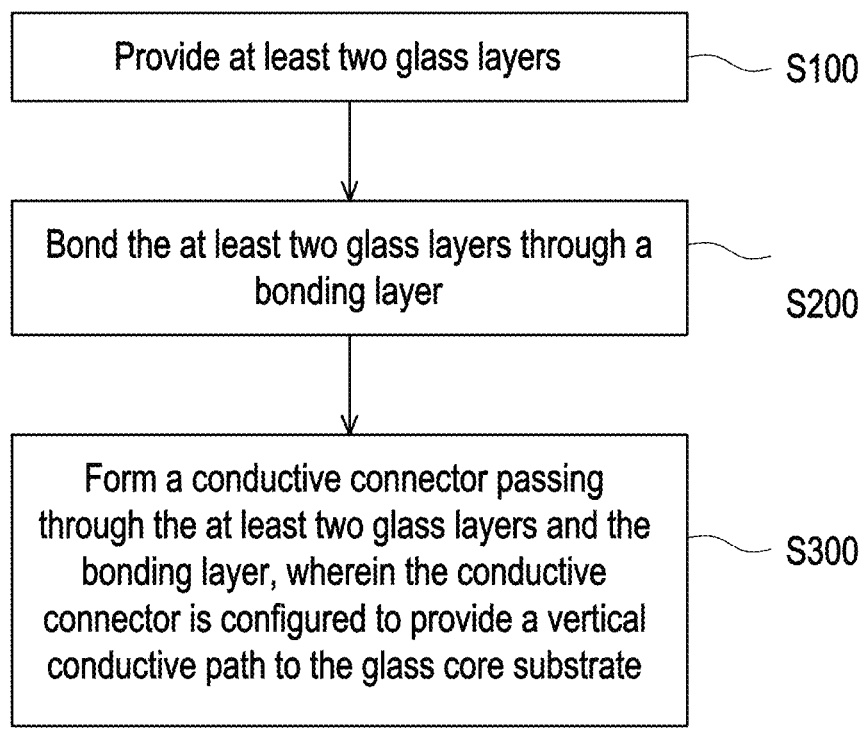
FIG. 1A is a schematic view of a manufacturing process of a glass core substrate according to an embodiment of this disclosure.

Exemplary embodiments of this disclosure will be fully described below with reference to the drawings, but this disclosure may also be implemented in many different forms and should not be interpreted as limited to the embodiments described herein.

This disclosure is explained more fully with reference to the drawings of this embodiment. However, this disclosure may also be embodied in various forms and should not be limited to the embodiments described herein. The thickness, size, or dimensions of layers or regions depicted in the drawings may be exaggerated for clarity. The same or similar reference numerals indicate the same or similar elements and will not be repeated individually in the following paragraphs.

Directional terms (e.g., up, down, right, left, front, back, top, bottom) are used with reference to the drawings and are not intended to imply absolute orientation.

Although the terms "first," "second," "third," etc. are used herein to describe various elements, components, regions, layers, and/or parts, these elements, components, regions, and/or parts shall not be limited by these terms. These terms are used to distinguish one element, component, region, layer, or part from another element, component, region, layer, or part.

Unless otherwise defined, all terms (including technical and scientific) used herein have the same meaning as commonly understood by one ordinarily skilled in the art to which this disclosure belongs.

Unless otherwise stated, the term "between" used to define numerical ranges in this specification intends to cover a range equal to and between the endpoint values. For example, a size range being between a first value and a second value means that the size range covers the first value, the second value, and any value between the first value and the second value.

FIG. 1A is a schematic view of a manufacturing process of a glass core substrate according to an embodiment of this disclosure. Please refer to FIG. 1A. First, at least two glass layers are provided (Step S100). Next, the at least two glass layers are bonded through a bonding layer (Step S200). Then, a conductive connector passing through the at least two glass layers and the bonding layer is formed, wherein the conductive connector is configured to provide a vertical conductive path of the glass core substrate (Step S300). Accordingly, in this disclosure, the bonding layer is used as a crack-stopping structure through the design of the stacked glass layers (a three-dimensional heterogeneous integrated glass core). In this way, the phenomenon of rapid propagation of brittle cracks from the edge to the center of the substrate can be reduced, effectively inhibiting the propagation of cracks, thereby improving the reliability of a subsequent product.

The specific implementation of various glass core substrates that may be formed corresponding to the manufacturing process will be described in detail below. The implementation of the various glass core substrates disclosed below are illustrative descriptions, and different features may be combined arbitrarily according to the actual design requirements. Any content that may be reasonably extended without departing from the spirit of the disclosure belongs to the protection scope of the disclosure.

This disclosure takes three layers of stacked glass layers as an example. However, fewer or more stacked glass layers may be formed according to actual design requirements. As long as at least two glass layers are bonded through a bonding layer and a vertical conductive path is provided by a conductive connector, the features belong to the protection scope of this disclosure.

Figure 1B:
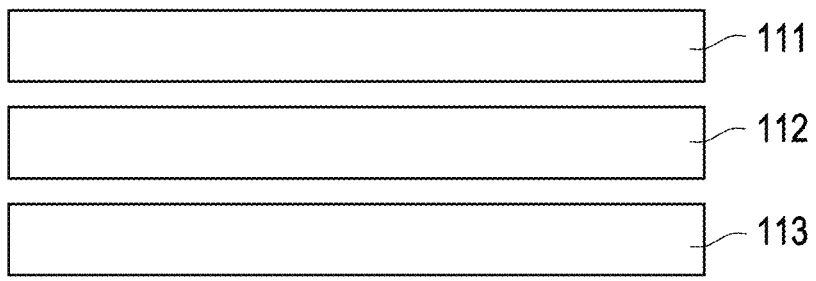
FIG. 1B to FIG. 1H are partially schematic cross-sectional views of a manufacturing method of a glass core substrate according to some embodiments of this disclosure.
Figure 1C:
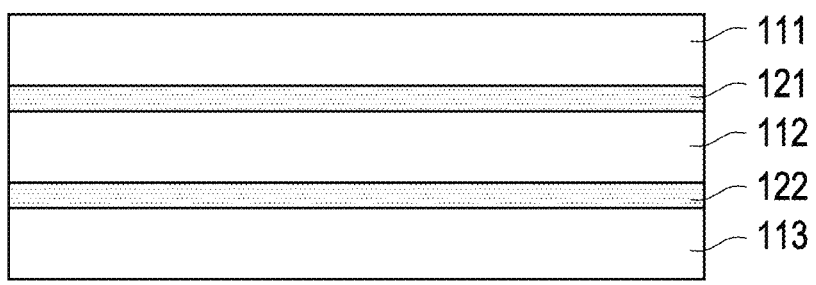

Please refer to FIG. 1B and FIG. 1C. In this embodiment, first, a glass layer 111, a glass layer 112, and a glass layer 113 are provided, and a bonding layer 121 and a bonding layer 122 are respectively formed between the glass layer 111 and the glass layer 112 and the glass layer 112 and the glass layer 113. For example, the bonding layer 121 and the bonding layer 122 are formed comprehensively and respectively extend from one side to the other side (such as from the left side to the right side in the drawings) between the glass layer 111 and the glass layer 112 and between the glass layer 112 and the glass layer 113 to improve the bonding strength and have a better crack-stopping effect, that is, there are no substantial gaps between the glass layer 111 and the glass layer 112 and between the glass layer 112 and the glass layer 113 to better intercept the cracks, but the disclosure is not limited thereto.

Figure 1D:
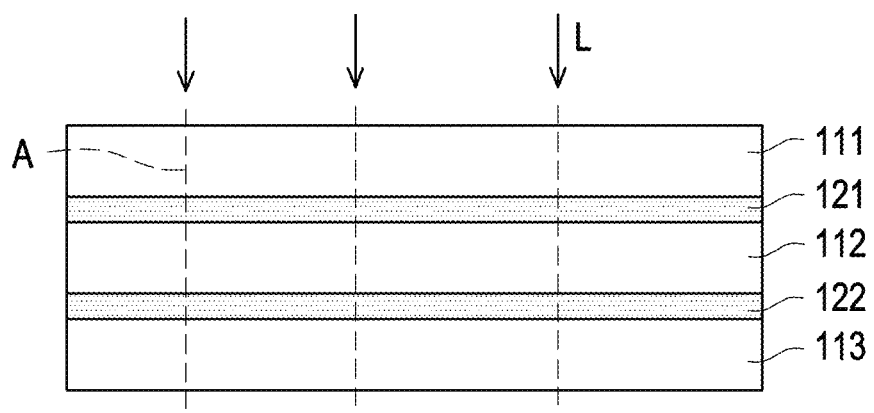
Figure 1E:
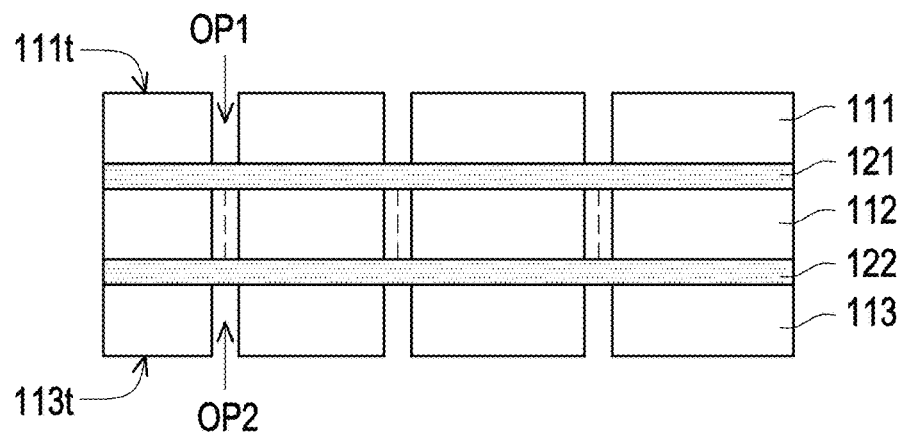
Figure 1F:
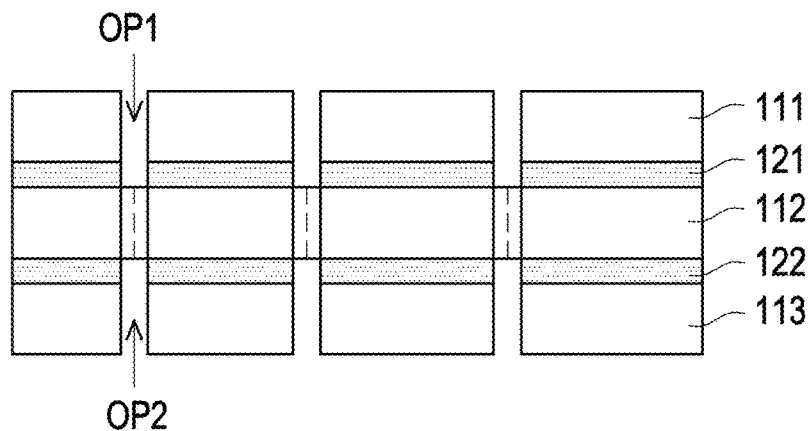
Figure 1G:
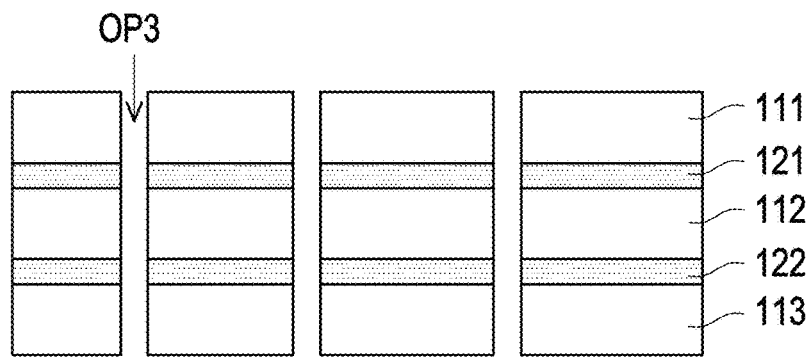
Figure 1H:
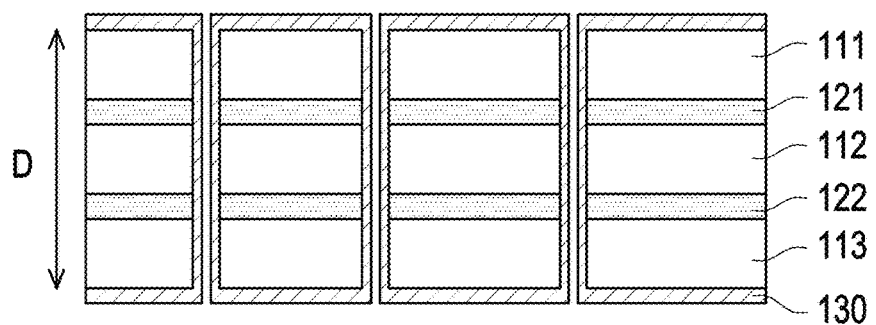

The following describes the steps of forming a conductive connector 130 (shown in FIG. 1H). First, please refer to FIG. 1D. A laser modification process is optionally executed on the glass layer 111, the bonding layer 121, the glass layer 112, the bonding layer 122, and the glass layer 113. For example, a laser beam L is applied to each of the layers to improve the etching ability of a laser passing region A (a dashed line region), thereby reducing the time and difficulty of the subsequent etching process. Here, the laser beam L may be a short-wavelength picosecond laser or the like, and after executing the laser modification process, no holes that actually penetrate each of the layers are generated.

In this embodiment, materials of the bonding layer 121 and the bonding layer 122 include polyimide (PI), benzocyclobutene (BCB), or a combination thereof, but the disclosure is not limited thereto.

Referring to FIG. 1E, after executing the laser modification process, an etching process is executed on the laser passing region A (a modified region) of the glass layer 111 and the glass layer 113 to form multiple openings OP1 and openings OP2, wherein the opening OP1 exposes the bonding layer 121, and the opening OP2 exposes the bonding layer 122. That is to say, an etchant in the etching process starts etching inward from a surface 111$t$ of the glass layer 111 until the etchant stops at the surface of the bonding layer 121, and the etchant on the other side starts etching inward from a surface 113$t$ of the glass layer 113 until the etchant stops at the surface of the bonding layer 122. In other words, in this step, the glass layer 112, the bonding layer 121, and the bonding layer 122 are not substantially etched. Here, the etchant may be hydrogen fluoride (HF) or the like.

In an embodiment not shown, when the etching process takes a long time, the opening has a maximum width at the edges of the glass layers on both sides. That is, the size of the opening is tapered toward the bonding layer, but this disclosure is not limited thereto.

Please refer to FIG. 1F. After forming the openings OP1 and the openings OP2, an etching process is executed on parts of the bonding layer 121 and the bonding layer 122 exposed by the opening OP1 and the opening OP2, so that the opening OP1 and the opening OP2 continue to extend inward until the glass layer 112, so that surfaces on the opposite side of the glass layer 112 are exposed. Here, the etching process may be plasma etching or wet etching (the etchant may be of any suitable type).

Referring to FIG. 1G, an etching process is executed on the laser passing region A of the glass layer 112, so that the opening OP1 and the opening OP2 continue to extend inward until the opening OP1 and the opening OP2 are connected to each other to form an opening OP3, wherein the opening OP3 penetrates the glass layer 111 from the glass layer 113, that is, the opening OP3 passes through the glass layer 111, the bonding layer 121, the glass layer 112, the bonding layer 122, and the glass layer 113 in sequence. Here, the etchant may be hydrogen fluoride (HF) or the like.

In an embodiment not shown, when the laser beam L in FIG. 1D does not penetrate the bonding layer 121 and the bonding layer 122, the etching process may also be executed directly in this step.

Figure 1I:
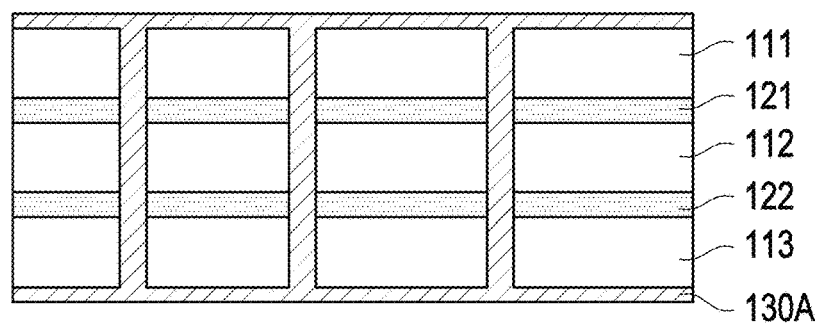
FIG. 1I is a partially schematic cross-sectional view of an alternative embodiment of FIG. 1H.

Referring to FIG. 1H, a conductive material is conformally formed on the surfaces of the glass layer 111 and the glass layer 113 and extends into the opening OP3 to form the conductive connector 130, whereby a glass core part 100 of the glass core substrate is substantially completed, but the disclosure is not limited thereto. In an alternative embodiment, as shown in FIG. 1I, a conductive connector 130A of a glass core part 101 may fill the opening OP3, wherein the conductive connector 130/conductive connector 130A may provide a vertical conductive path D of the glass core part 100/glass core part 101 and may be called a "through glass via" (TGV). According to this, when a subsequent crack exists at the edge of any one of the glass layer 111, the glass layer 112, and the glass layer 113, the crack encounters the obstruction of the bonding layer 121 and the bonding layer 122 during the process of the crack propagating toward the center of the substrate, so the bonding layer 121 and the bonding layer 122 may be regarded as crack-stopping structures.

In some embodiments, the conductive connector 130 may be formed by a copper plating process such as sputtering, atomic layer deposition, or electroless plating, and before the formation of the conductive connector 130, an additional titanium (Ti) seed layer (not shown) may be formed through the process, but the disclosure is not limited thereto.

In this embodiment, forming the conductive connector 130 passing through the glass layer 111, the bonding layer 121, the glass layer 112, the bonding layer 122, and the glass layer 113 is completed in one step, that is, because the conductive material is formed in the opening OP3 penetrating the stacked glass layers (the glass layer 111, the glass layer 112, and the glass layer 113), the conductive connector 130 is not formed by bonding different conductive parts, so that the width of the conductive connector 130 in the bonding layer 121 and the bonding layer 122 is the same as the width in the glass layer 111, the glass layer 112, and the glass layer 113, but the disclosure is not limited thereto.

In some embodiments, the materials of the glass layer 111, the glass layer 112, and the glass layer 113 are different, so the coefficients of thermal expansion (CTE), the Young's modulus of the glass layer 111, the glass layer 112, and the glass layer 113 are different. For example, the glass layer 112 may be glass with a large coefficient of thermal expansion (such as glass with a CTE of 8 ppm at 25° C.), the glass layer 111 and the glass layer 113 may be glass with a coefficient of thermal expansion smaller than that of the glass layer 112 (such as glass with a CTE of smaller than 8 ppm at 25° C.), and the coefficient of thermal expansion of the glass layer 111 is equal to the coefficient of thermal expansion of the glass layer 113. Therefore, after high-temperature condensation, the indentation ability of the glass layer 112 is greater than the indentation abilities of the glass layer 111 and the glass layer 113, thereby pulling the glass layer 111 and the glass layer 113 inward, forming compression stress. In this way, the probability of crack generation and propagation in the glass layer 111 and the glass layer 113 can be more effectively reduced to improve the reliability of the subsequent product. At the same time, this design facilitates the manufacture of a large-sized and highly flat glass core substrate, thereby further improving element integration, but the disclosure is not limited thereto. The materials of the glass layer 111, the glass layer 112, and the glass layer 113 may be the same according to actual design requirements.

Figure 1J:
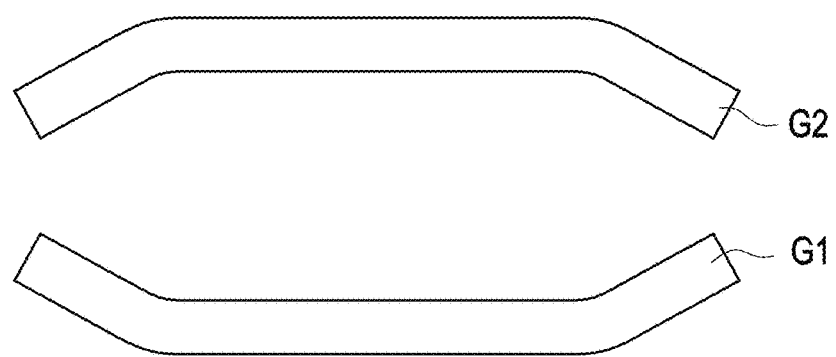
FIG. 1J is a schematic view illustrating a bonding process according to some embodiments of the disclosure.

In FIG. 1J, when the materials of adjacent glass layers G1, G2 are different and designed by aforementioned material rules, adjacent glass layers G1, G2 may have different warpage directions in upper portion and down portion, that is, a warpage direction of the glass layer G1 is opposite to a warpage direction of the glass layer G2, the stress may be effectively offset, thereby the warpage situation is reduced, wherein the glass layers G1, G2 can be two adjacent glass layers in the glass layer 111, the glass layer 112, and the glass layer 113. In this embodiment, only two glass layers are bonded to form the glass core substrate.

In some embodiments, the thicknesses of the glass layer 111, the glass layer 112, and the glass layer 113 are the same (such as a thickness of the first glass layer 111 nearly equal to a thickness of the third glass layer 113), but the disclosure is not limited thereto. In other embodiments, the thicknesses of the glass layer 111, the glass layer 112, and the glass layer 113 are different.

In some embodiments, the thickness of any of the glass layer 111, the glass layer 112, and the glass layer 113 is different from that of any of the bonding layer 121 and the bonding layer 122. For example, the thickness of any of the glass layer 111, the glass layer 112, and the glass layer 113 is greater than that of any of the bonding layer 121 and the bonding layer 122, but the disclosure is not limited thereto.

The following embodiments continue to use the reference numerals and some content of the above embodiment, wherein the same or similar numerals are used to represent the same or similar elements and the description of the same technical content is omitted. For the description of the omitted part, reference may be made to the foregoing embodiment and is not repeated in the following embodiments.

Figure 2A:
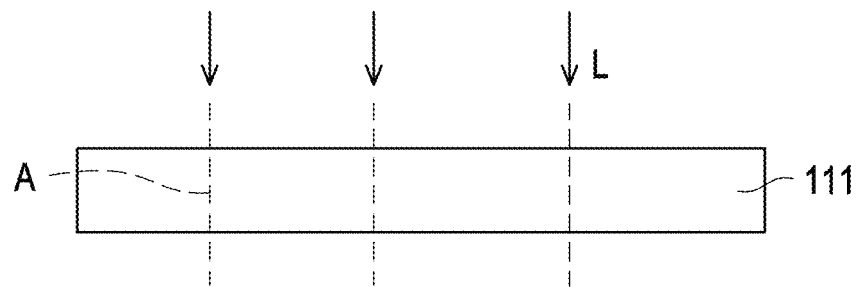
FIG. 2A to FIG. 2F are partially schematic cross-sectional views of a manufacturing method of a glass core substrate according to some embodiments of this disclosure.

Please refer to FIG. 2A. First, the glass layer 111 is provided. Next, a laser modification process is executed on the glass layer 111. For example, the laser beam L may be applied to the glass layer 111 to improve the etching ability through the laser passing region A (the dashed line region). The relevant details are similar to FIG. 1D and are not to be described again here.

Figure 2B:
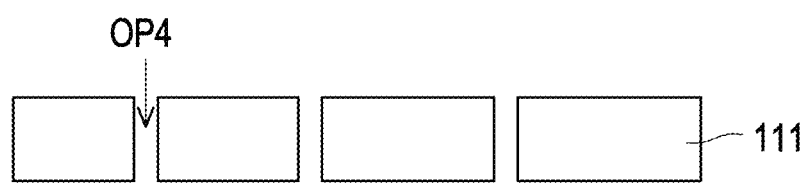

Referring to FIG. 2B, an etching process is executed on the laser-modified region A of the glass layer 111 to form an opening OP4 penetrating the glass layer 111. The etchant may be hydrogen fluoride or the like.

Figure 2C:
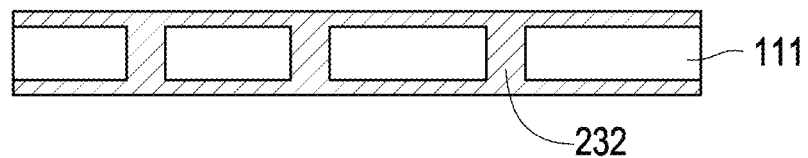
Figure 2D:
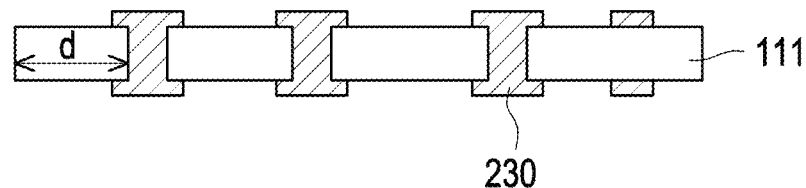

Referring to FIG. 2C and FIG. 2D, a conductive material 232 is formed on the surface of the glass layer 111 and extends into the opening OP4, and the conductive material 232 fills the opening OP4. Then, a patterning process is executed on the conductive material 232 to expose an upper surface and a lower surface of a part of the glass layer 111 to form a conductive connector 230. Here, a distance d between the conductive connector 230 and the edge of the glass layer 111 may not be less than twice the diameter of the conductive connector 230, and this design criterion is also applicable to the design of other glass layers.

Figure 2E:
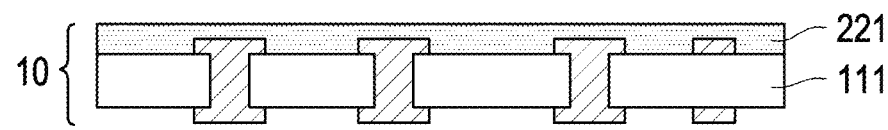
Figure 2F:
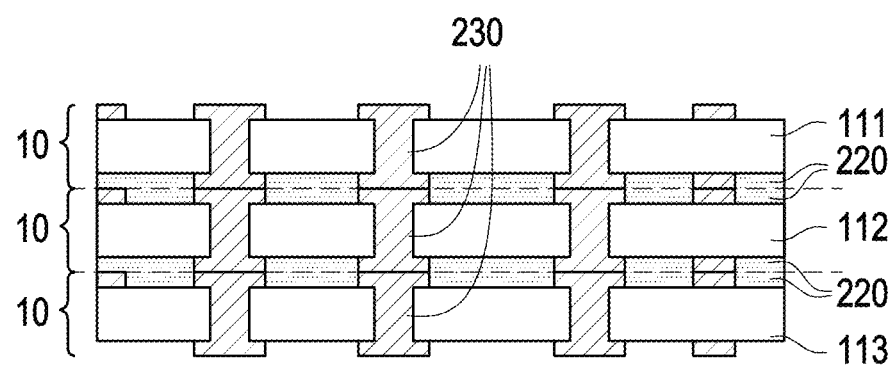

Please refer to FIG. 2E and FIG. 2F. An adhesive material 221 (such as polyimide, benzocyclobutene, and other organic materials or silicon dioxide ($SiO_2$) and other inorganic materials) is formed on the surface of the glass layer 111 to form a bonding component 10. Next, a planarization process, such as a chemical mechanical polishing (CMP) process, is optionally executed on the bonding component 10 to facilitate a subsequent copper-to-copper (Cu to Cu)

direct bonding process such as hybrid bonding (as shown as the bonding layer 220 in FIG. 2F). Then, the steps from FIG. 2A to FIG. 2E are repeated to form other bonding components 10, and the bonding components 10 are bonded to each other to form a glass core part 200 of the glass core substrate. For the middle bonding component 10 in the step of FIG. 2E, the adhesive material 221 needs to be further formed on another surface of the glass layer 112 and a planarization process may be optionally executed. Here, the bonding layer 220 between the glass layer 111 and the glass layer 112 is similar to the bonding layer 121, the bonding layer 220 between the glass layer 112 and the glass layer 113 is similar to the bonding layer 122, and the conductive connectors 230 are similar to the conductive connector 130A after being connected in series. Therefore, in this embodiment, the conductive connector passing through the glass layer and the bonding layer is formed by multiple steps. Although three bonding components 10 with the same composition are shown, the materials and circuit designs in the bonding components 10 may be different according to actual design requirements.

In this embodiment, the width of the conductive connector 230 in the bonding layer 220 is larger than the width of the conductive connector 230 in the glass layer 111, the glass layer 112, and the glass layer 113, but the disclosure is not limited thereto.

Figure 2G:
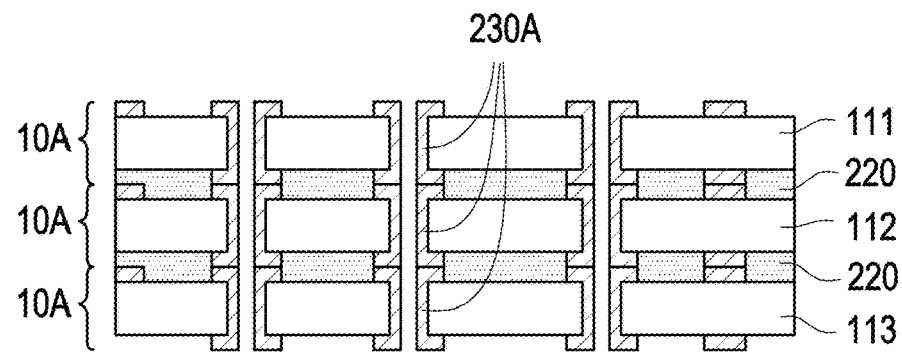
FIG. 2G, FIG. 2H, and FIG. 2I are partially schematic cross-sectional views of some alternative embodiments of FIG. 2F.

Please refer to FIG. 2G. Compared with the glass core part 200 of FIG. 2F, a conductive connector 230A of a glass core part 201 of this embodiment is formed conformally. That is, in the step of FIG. 2C, the conductive material is formed conformally.

Figure 2H:
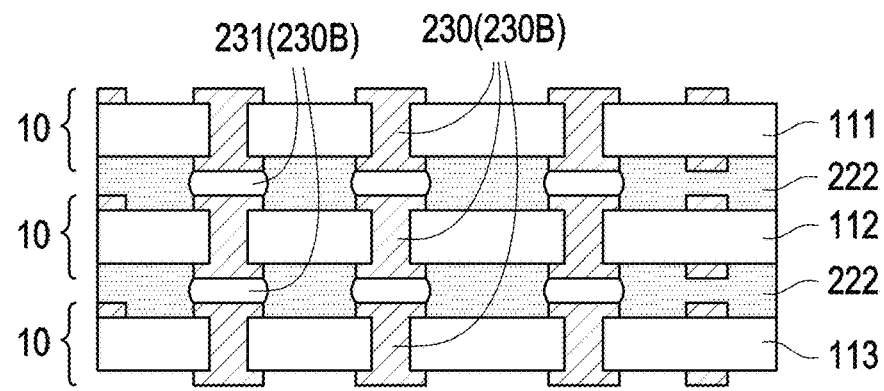

Please refer to FIG. 2H. Compared with the glass core part 200 of FIG. 2F, a conductive connector 230B of a glass core part 202 of this embodiment includes the conductive connector 230 of FIG. 2D and a conductive connector 231 formed by the conductive adhesive material (such as silver glue or copper glue), that is, the bonding components 10 may be bonded and electrically connected through the conductive connector 231, wherein multiple structures shown in FIG. 2D may be subjected to an adhesive bonding process. Next, after the structures are bonded to each other through the conductive connector 231, a filling material 222 (such as a suitable gap-fill polymer) is filled in the gap between the glass layers.

Figure 2I:
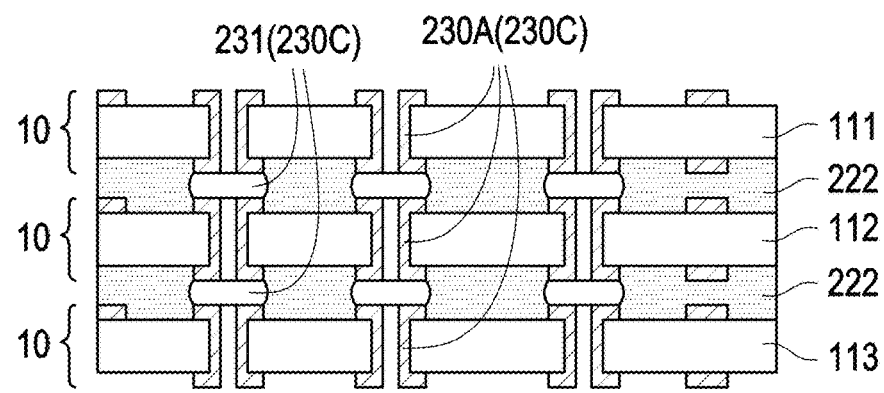

Please refer to FIG. 2I. Compared with the glass core part 202 of FIG. 2H, a conductive connector 230C of a glass core part 203 of this embodiment includes the conductive connector 230A of FIG. 2G and the conductive connector 231 formed by the conductive adhesive material (such as silver glue or copper glue).

Although FIG. 2F to FIG. 2I illustrate that the bonding components are entirely aligned, the disclosure is not limited thereto. In an embodiment not shown, the bonding components may not be entirely aligned. In other words, conductive connectors may be misaligned and partially in contact.

Figure 3A:
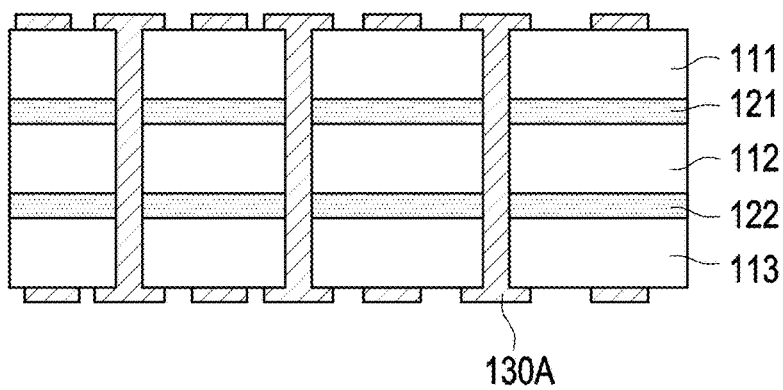
FIG. 3A to FIG. 3B are partially schematic cross-sectional views of a manufacturing method of a glass core substrate according to some embodiments of this disclosure.
Figure 3B:
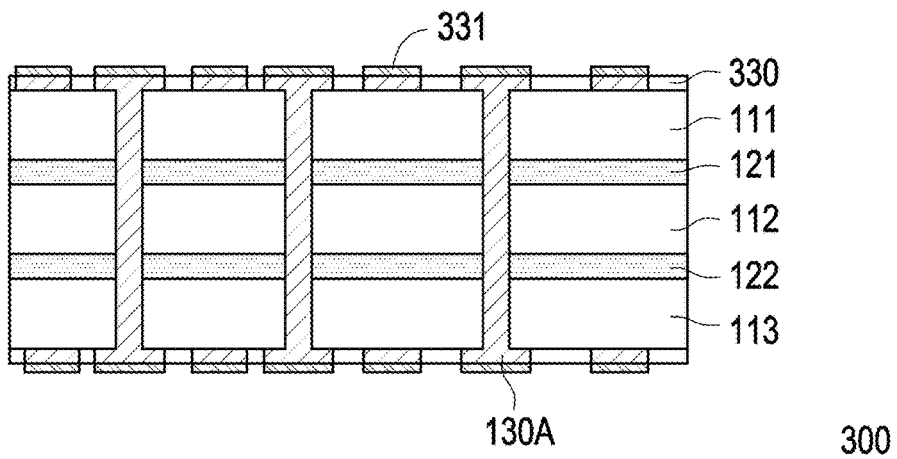

Referring to FIG. 3A and FIG. 3B. The glass core part 101 of FIG. 1I is provided, and a patterning process is executed on the conductive connector 130A to expose parts of the surfaces of the glass layer 111 and the glass layer 113. Next, a solder resist layer 330 is formed on the exposed surfaces of the glass layer 111 and the glass layer 113 to surround the part of the conductive connector 130A located on the surfaces of the glass layer 111 and the glass layer 113. Optionally, a surface treatment may be performed on the part of the conductive connector 130A between the solder resist layer 330 to further form a surface treatment layer 331 disposed on at least one end of the glass core substrate 300, such as a nickel/gold (Ni/Au) layer to improve electrical performance. In this way, the glass core substrate 300 is roughly completed.

Figure 3C:
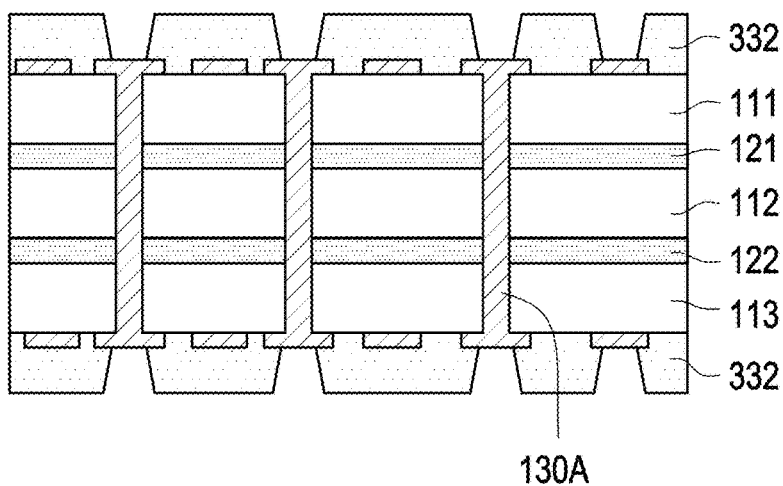
FIG. 3C to FIG. 3E are partially schematic cross-sectional views of a manufacturing method of a glass core substrate according to some embodiments of this disclosure.
Figure 3D:
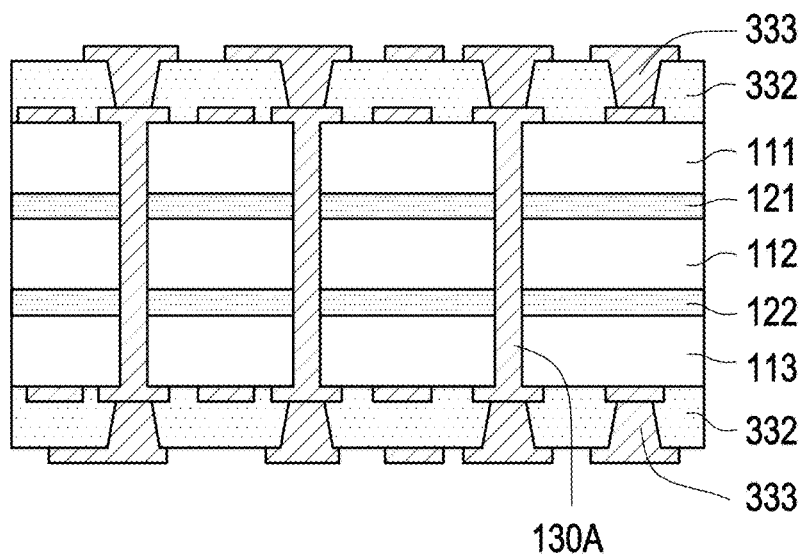
Figure 3E:
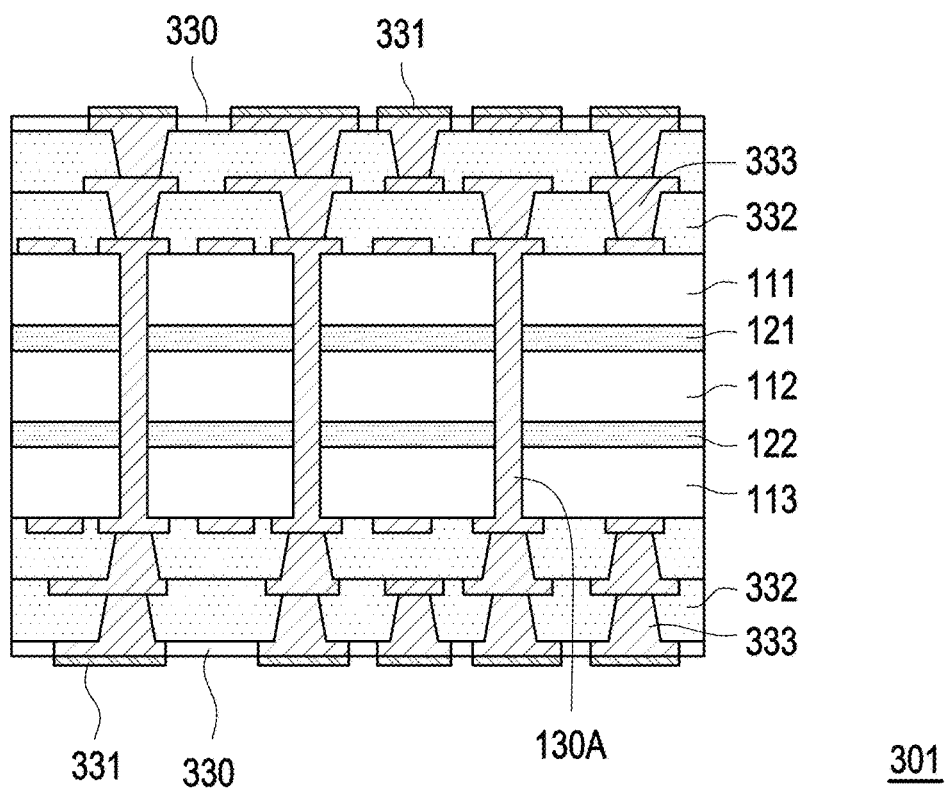

Please refer to FIG. 3C and FIG. 3E. Following the glass core part 101 of FIG. 1I, a patterning process is executed on the conductive connector 130A to expose parts of the surfaces of the glass layer 111 and the glass layer 113. Next, a dielectric layer 332 including multiple openings (the openings are formed in an ABF material through laser drilling or the openings are formed in photo-sensitive polyimide (PSPI) through a photolithography etching process) is formed on the surfaces of the glass layer 111 and the glass layer 113. Also, a conductive layer 333 (with a material such as copper) is formed in the openings to form a circuit layer. Then, the solder resist layer 330 and the surface treatment layer 331 are formed on the outermost conductive layer 333. In this way, a glass core substrate 301 is roughly completed. The steps of FIG. 3C to FIG. 3D may be repeated multiple times according to actual design requirements to form multiple circuit layers.

Figure 4A:
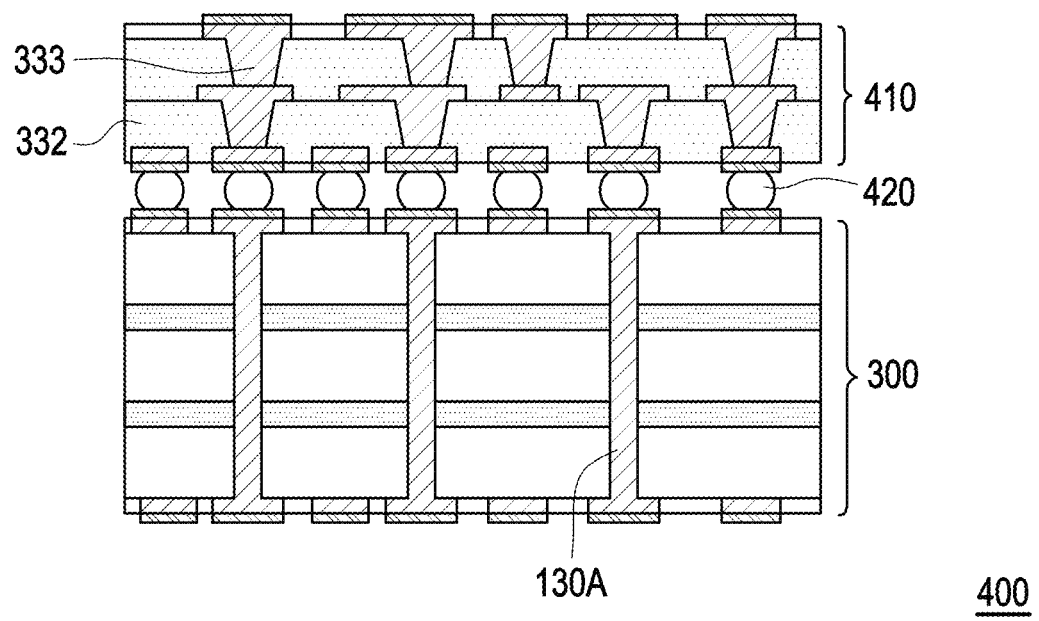
FIG. 4A, FIG. 4B, FIG. 4C, and FIG. 4D are partially schematic cross-sectional views of a glass core substrate according to some embodiments of this disclosure.

Please refer to FIG. 4A. Compared with the glass core substrate 300 of FIG. 3B, a glass core substrate 400 of this embodiment further includes a circuit layer 410 and multiple solder balls 420. The solder balls 420 are located between the circuit layer 410 and the conductive connector 130A, and the circuit layer 410 is composed of a structure similar to the alternating stacking of the dielectric layer 332 and the conductive layer 333, which is not limited by this disclosure.

Figure 4B:
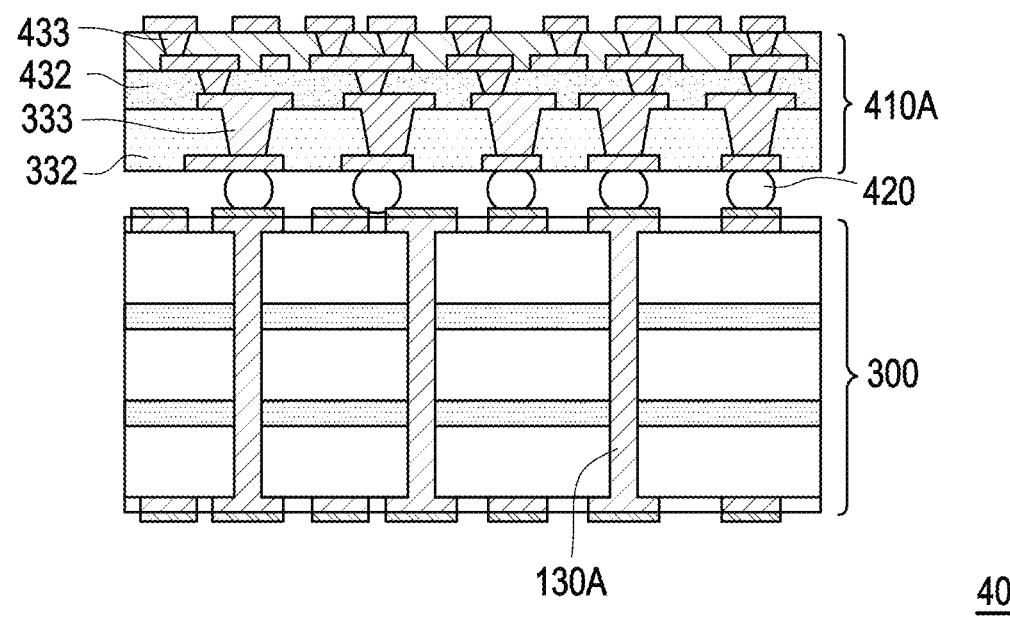

Please refer to FIG. 4B. Compared with the glass core substrate 400 of FIG. 4A, a circuit layer 410A of a glass core substrate 401 of this embodiment has different line spacings. For example, the glass core substrate 401 may have circuit layers similar to a circuit layer with a thick spacing (such as a copper wire with a line width spacing from about 5 microns to about 25 microns) composed of the dielectric layer 332 and the conductive layer 333 and a circuit layer with a thin spacing (such as a copper conductor with a line width spacing from about 1.0 microns to about 10 microns) composed of a dielectric layer 432 (such as benzocyclobutene (BCB) or other suitable organic material such as polyimide) and a conductive layer 433 (with a material such as copper).

Figure 4C:
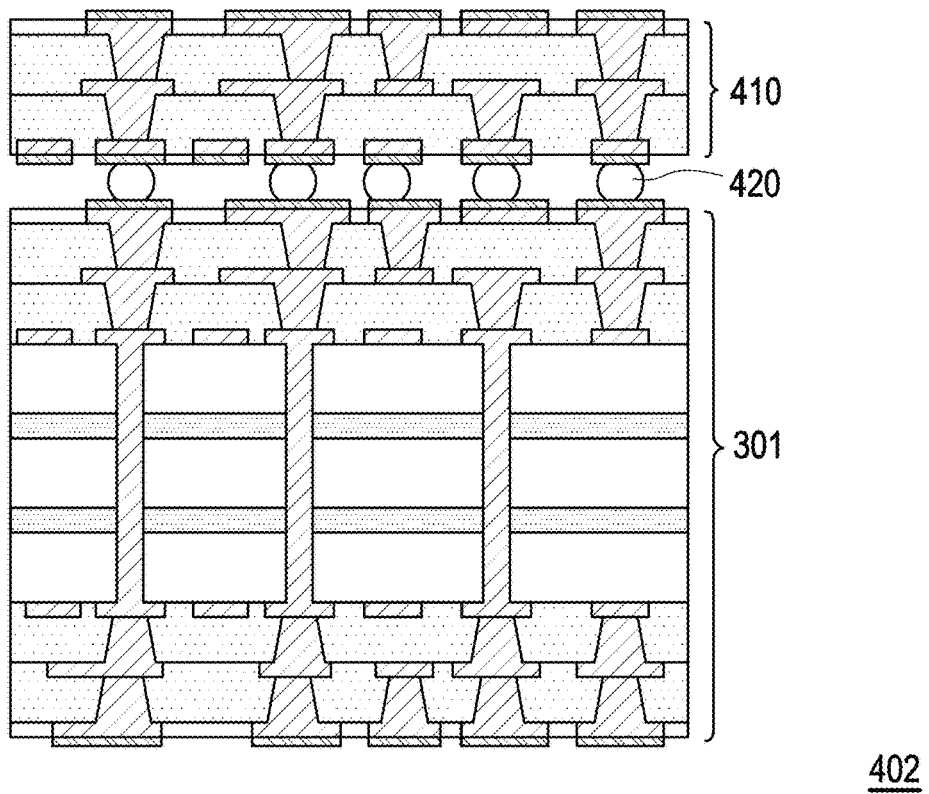

Please refer to FIG. 4C. Compared with the glass core substrate 400 of FIG. 4A, a glass core substrate 402 of this embodiment uses the glass core substrate 301 of FIG. 3E.

Figure 4D:
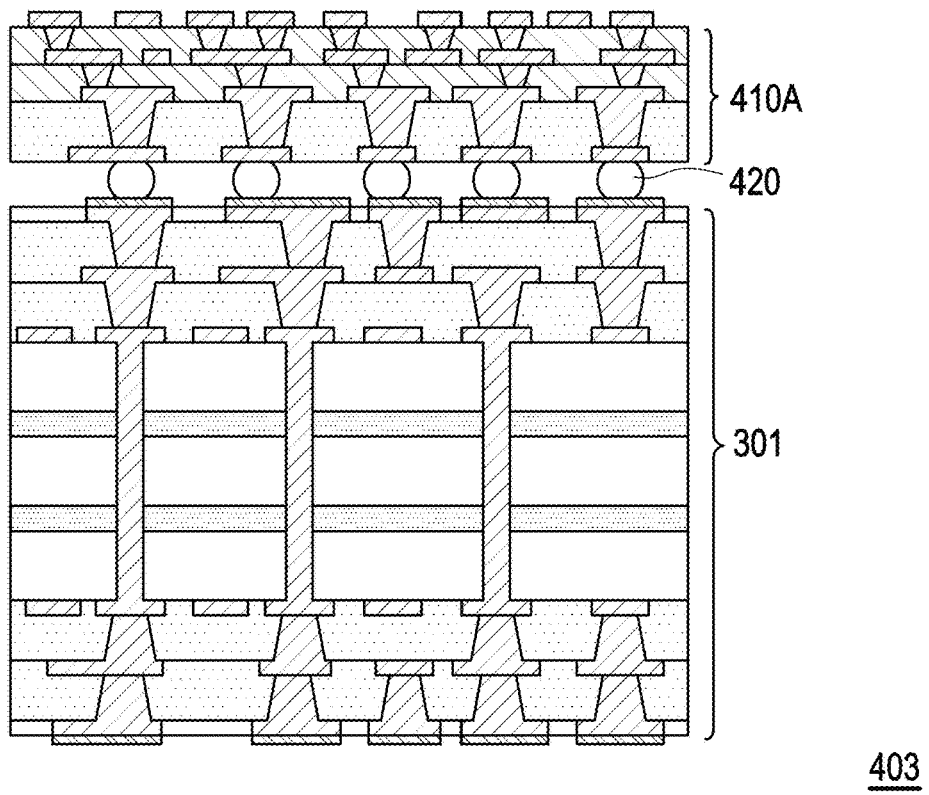

Please refer to FIG. 4D. Compared with the glass core substrate 401 of FIG. 4B, a glass core substrate 403 of this embodiment uses the glass core substrate 301 of FIG. 3E.

The circuit layer mentioned above is an exemplary description, and any appropriate circuit may be used according to actual design requirements. For example, a structure of alternately stacking the dielectric layer 332 and the conductive layer 333 may be a redistribution circuit layer (RDL).

Figure 5A:
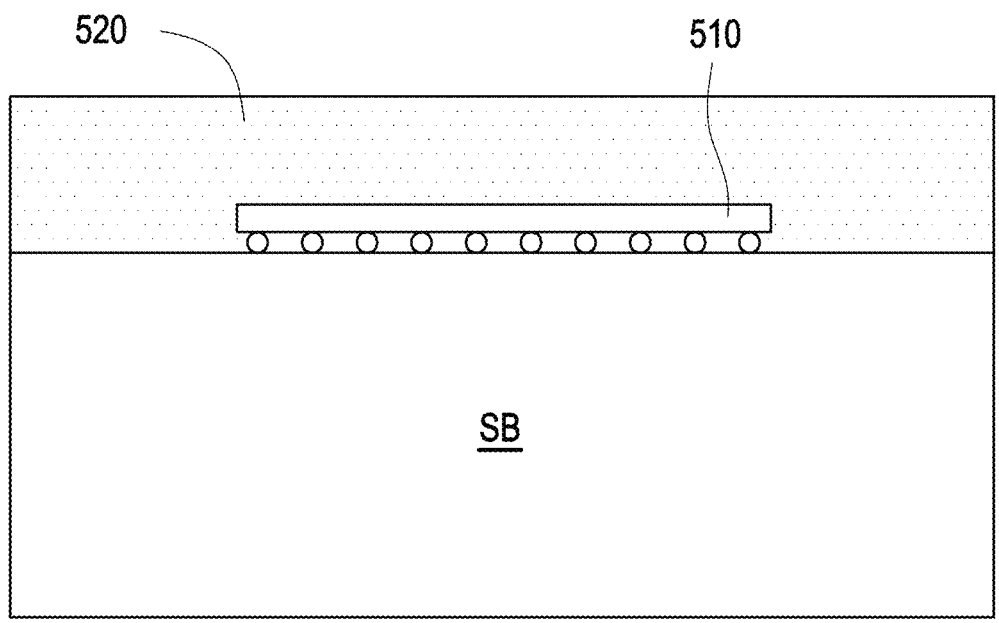
FIG. 5A and FIG. 5B are partially schematic cross-sectional views of an application of a glass core substrate according to some embodiments of this disclosure.

Please refer to FIG. 5A. In an electronic assembly of this embodiment, a chip 510 is disposed on a glass core substrate SB, and the chip 510 is optionally encapsulated by an encapsulation body 520. The glass core substrate SB may be a specific implementation of the various glass core substrates above, such as the glass core substrates 300, 301, 400, 401, 402, 403, or the like.

In some embodiments, the chip 510 is connected to the surface of the glass core substrate SB using, for example, flip-chip bonding. For example, a conductive bump of the chip 510 may be in direct contact with a surface circuit of the glass core substrate SB to form an electrical connection, but the disclosure is not limited thereto. The chip 510 may also be bonded to the surface of the glass core substrate SB using other suitable methods. The chip 510 here is, for example, a logic chip, a memory chip, a three-dimensional integrated circuit (3DIC) chip (such as a high bandwidth memory chip), XPU, I/O, CPO, and/or the like. The 3DIC chip includes multiple layers stacked on each other and is formed with through-silicon vias (TSVs) to provide vertical electrical connections between the layers, but the disclosure is not limited thereto.

Although only one chip 510 is shown in the current drawing, this disclosure does not limit the number of the chip 510. The number of the chip 510 may be determined according to actual design requirements, such as two or more chips with the same or different functions.

In some embodiments, the encapsulation body 520 may be a molding compound formed by a molding process, such as being formed by an insulating material such as epoxy resin or other suitable resins, but the disclosure is not limited thereto.

Figure 5B:
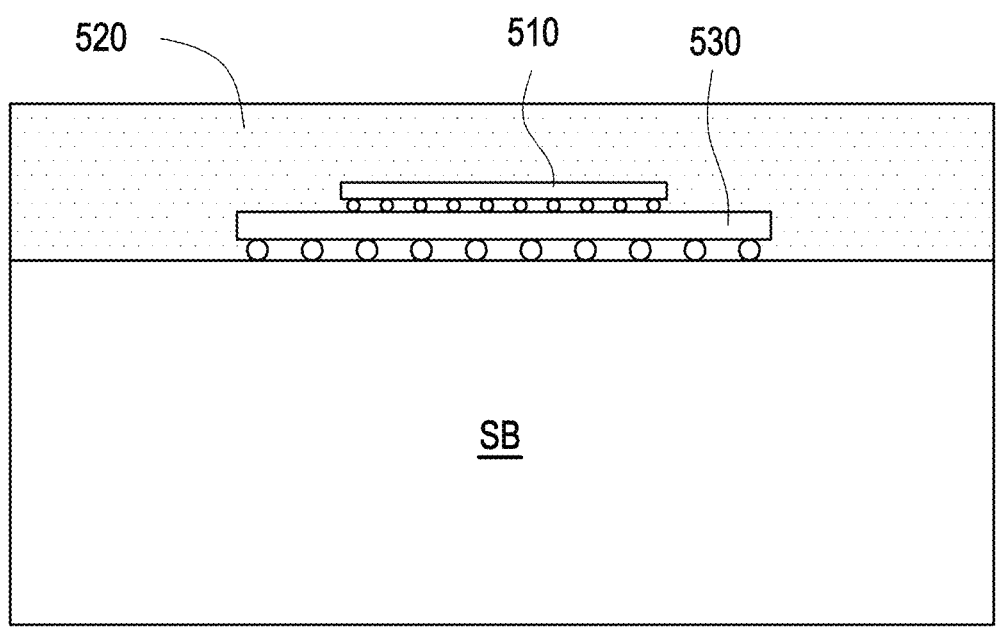

Please refer to FIG. 5B. Compared with the embodiment of FIG. 5A, the electronic assembly of this embodiment further includes an interposer layer 530 disposed between the chip 510 and the glass core substrate SB, wherein the interposer layer 530 may be any suitable type, which is not limited by this disclosure.

Figure 6A:
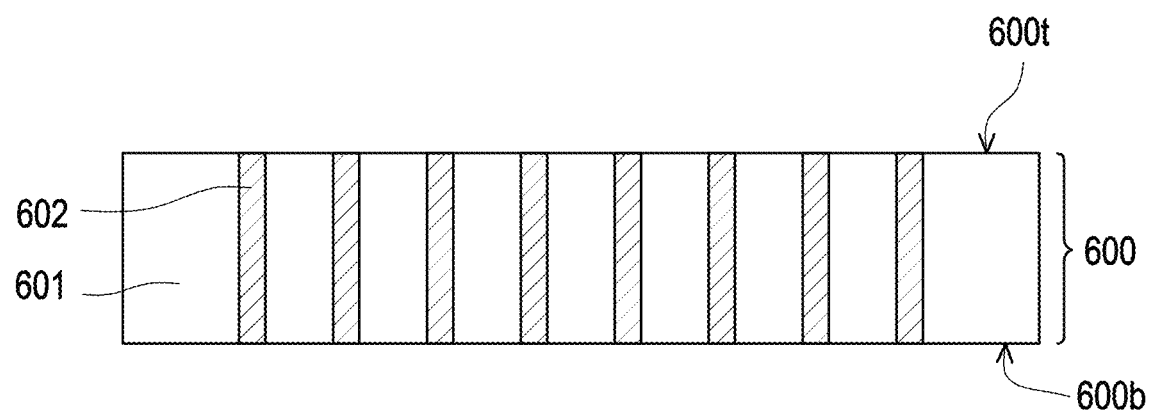
FIG. 6A to FIG. 6F are partially schematic cross-sectional views of a manufacturing method of a substrate according to some embodiments of this disclosure.

Please refer to FIG. 6A. In this embodiment, a core layer 600 having a first surface 600t (as shown a top surface) and a second surface 600b (as shown a bottom surface) opposite the first surface 600t is provided. For example, the core layer 600 includes the base material layer 601 and a plurality of vertical conductive connectors 602, wherein the vertical conductive connectors 602 are penetrating through the base material layer 601. Herein, material of the core layer 600 includes glass, ceramic, organic compound, or a combination thereof.

In some embodiments, the base material layer 601 is glass, the core layer 600 may be a specific implementation of the various glass core substrates above, such as the glass core substrates 100, 101, 200, 201, 202, 203, 300, or the like. In some embodiments, the base material layer 601 is ceramic, the vertical conductive connectors 602 may be suitable TCV, which is not limited by this disclosure.

Optionally, liquid filling material, low viscosity film type materials, or the like may be use to fill the gap between the base material layer 601 and the vertical conductive connectors 602 (such as copper pillars), but the disclosure is not limited thereto.

Figure 6B:
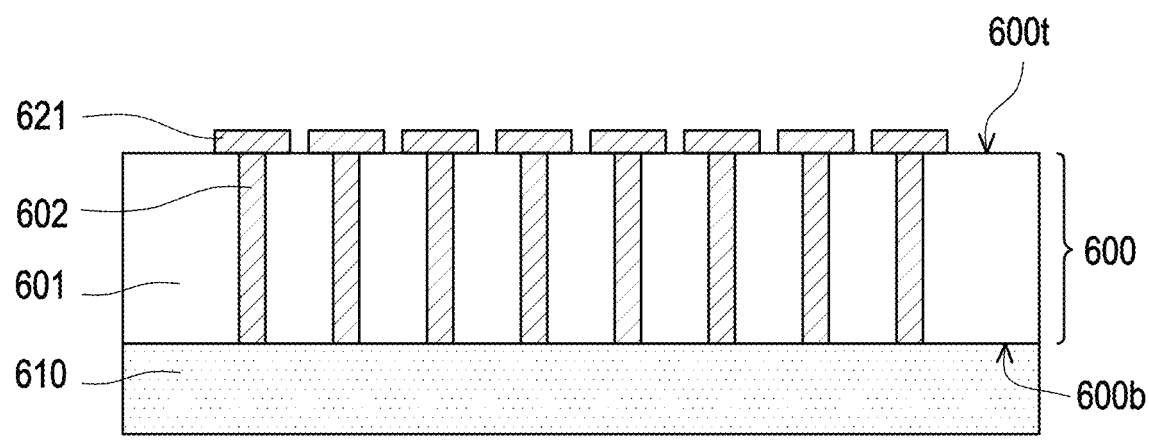

Please refer to FIG. 6B, a first film 610 is formed on the core layer 600, wherein the first film 610 covers the second surface 600b of the core layer 600. In this way, the first film 610 may protect the second surface 600b of the core layer 600 to reduce materials (such as the vertical conductive connectors 602) oxidation and damage of the core layer 600 caused by mechanical force, such that the first film 610 may have protective function. Further, the first film 610 may be used to compensate stress between the core layer 600 and the structure formed thereon, by doing so, the degree of the warpage may be reduced, such that the first film 610 may have warpage control function. Herein, the first film 610 may be in direct contact with the vertical conductive connectors 602.

In some embodiments, the first film 610 is formed by lamination process, but the disclosure is not limited thereto. In some embodiments, material of the first film 610 comprises organic film material such as polyimide with coefficients of thermal expansion different than a dielectric layer 622 of the redistribution circuit layer 620 (subsequently formed thereon), but the disclosure is not limited thereto. In some embodiments, a thickness of the first film 610 ranges between 100 microns (um) and 500 microns, but the disclosure is not limited thereto.

Next, a conductive layer 621 is formed on the first surface 600t of the core layer 600 with the first film 610. In some embodiments, the conductive layer 621 may be pads and formed of copper, gold, nickel, aluminum, platinum, tin, combinations thereof, alloys thereof, or other suitable conductive materials by suitable depositing process. The conductive layer 621 is electrically connected to the core layer 600.

Figure 6C:
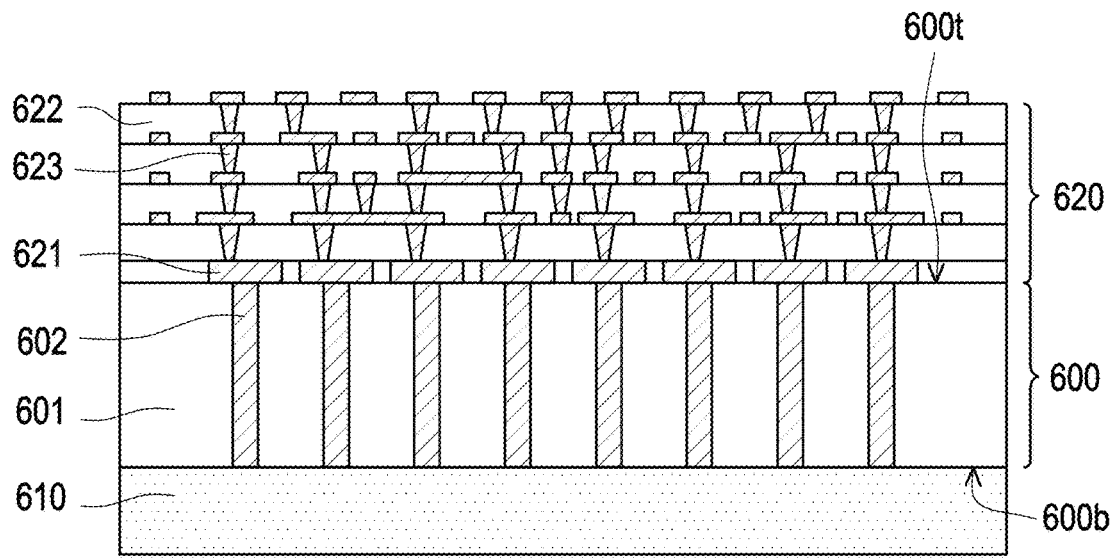

Please refer to FIG. 6C, a dielectric layer 622 including a plurality of openings are formed on the conductive layer 621 by suitable depositing process and then another conductive layer 621 is formed on the dielectric layer 622, wherein a plurality of vias 623 may be formed in the openings between adjacent conductive layer 621. The steps may be repeated multiple times according to actual design requirements to form a redistribution circuit layer 620. For example, materials of the dielectric layers 622 include photosensitive polyimide, BCB, but the disclosure is not limited thereto. Herein, the redistribution circuit layer 620 has fine pitch configured to connect to the chip.

In some embodiments, the vias 623 may be formed of copper, gold, nickel, aluminum, platinum, tin, combinations thereof, alloys thereof, or other suitable conductive materials by suitable depositing process.

In not shown embodiments, further form a surface treatment layer disposed on a top surface of the redistribution circuit layer 620, such as a Cu/Ni/Cu layer to protect the bond pads from oxidation before next assembly process.

Figure 6D:
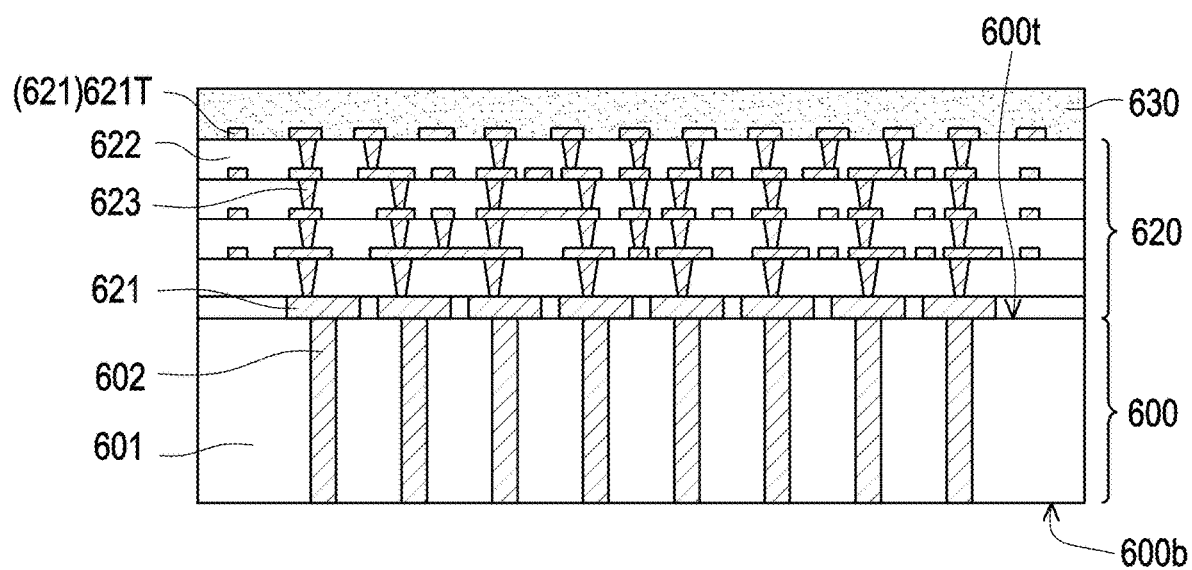

Please refer to FIG. 6D, the first film 610 is removed after forming the redistribution circuit layer 620. In some embodiments, laser debonding process may be used to remove the first film 610. And then, a second film 630 is optionally formed on the redistribution circuit layer 620. In this way, the second film 630 may protect the redistribution circuit layer 620 to reduce materials (such as the external pads 621T of the first redistribution circuit layer 620) oxidation and damage of the redistribution circuit layer 620 caused by mechanical force, such that the second film 630 may have protective function. Further, the second film 630 may be used to compensate stress between the redistribution circuit layer 620 and the structure formed thereon, by doing so, the degree of the warpage may be reduced, such that the second film 630 may have warpage control function. Herein, the external pads 621T may be embedded in the second film 630.

In some embodiments, the second film 630 is formed by lamination process, but the disclosure is not limited thereto. In some embodiments, material of the second film 630 comprises organic film material, such as polyimide with coefficients of thermal expansion different than a dielectric layer 642 of redistribution circuit layer 640 (subsequently formed thereon), but the disclosure is not limited thereto. In some embodiments, a thickness of the second film 630 ranges between 100 microns and 500 microns, but the disclosure is not limited thereto.

In some embodiments, the first film 610 is different from the second film 630 (such as materials, CTE, Young's modulus, thickness, or the like) to balance different process of forming redistribution circuit layer, but the disclosure is not limited thereto.

Figure 6E:
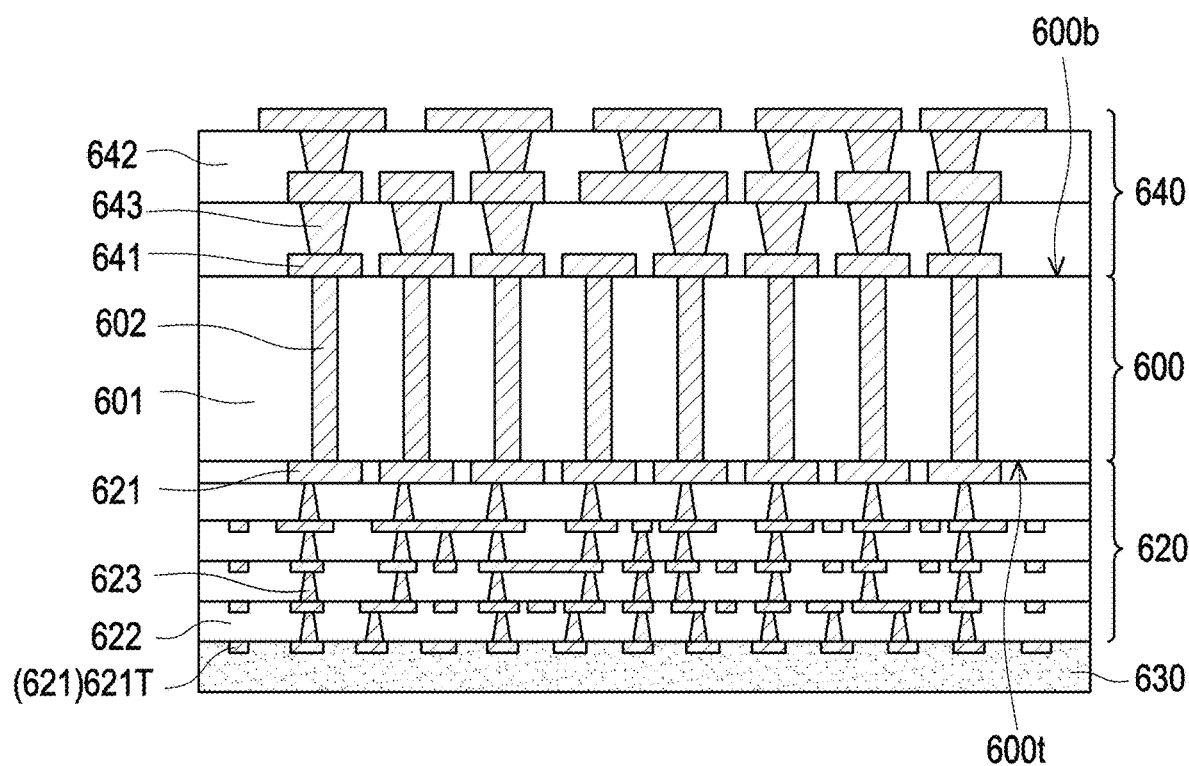
Figure 6F:
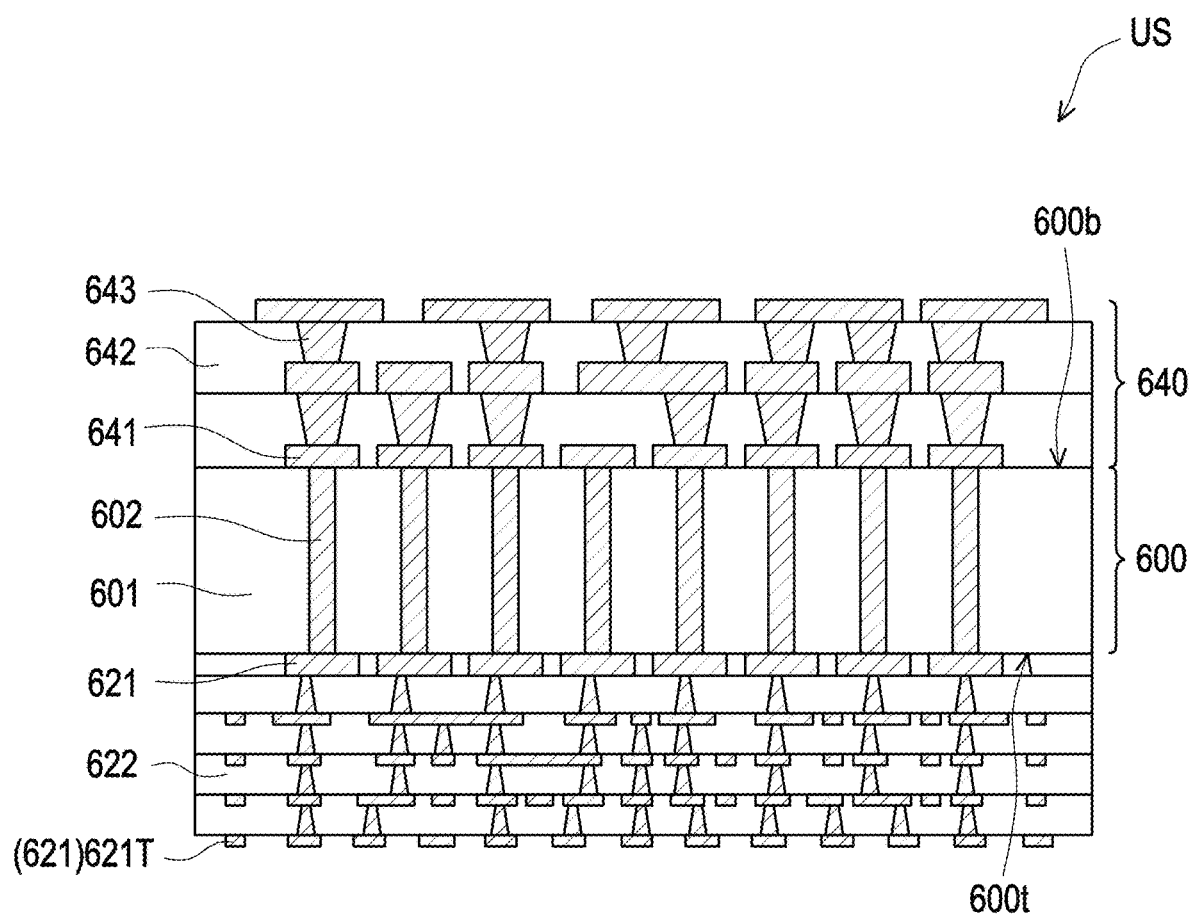

Please refer to FIG. 6E to FIG. 6F, after removing the first film 610 and forming the second film 630, a flipping upside-down process is performed. Next, a redistribution circuit layer 640 is formed on the second surface 600b of the core layer 600 with the second film 630 and the second film 630 is removed to configure an unsymmetric substrate US. For example, the redistribution circuit layer 640 includes a conductive layer 641 and a dielectric layer 642 alternately to each other by suitable depositing process, wherein a plurality of vias 643 may be formed between adjacent conductive layer 641. The steps may be repeated multiple times according to actual design requirements to form the redistribution circuit layer 640. Herein, the redistribution circuit layer 640 has coarse pitch greater than the pitch of the redistribution circuit layer 620. In some embodiments, an outer layer of the first redistribution circuit layer 620 has a first pitch, an outer layer of the second redistribution circuit layer 640 has a second pitch, and, the first pitch is smaller than the second pitch.

In some embodiments, the conductive layer 641 and vias 643 may be formed of copper, gold, nickel, aluminum, platinum, tin, combinations thereof, alloys thereof, or other suitable conductive materials. In some embodiments, materials of the dielectric layers 642 include ABF, but the disclosure is not limited thereto.

In the present embodiment, the substrate US includes the core layer 600, the first redistribution circuit layer 620 disposed on the first surface 600t of the core layer 600; and the second redistribution circuit layer 640 disposed on the second surface 600b of the core layer 600. For asymmetric design, the redistribution circuit layer 620 and the redistribution circuit layer 640 include one or more of following conditions: number of layers between the redistribution circuit layer 620 and the redistribution circuit layer 640 are different; thickness of layers between the redistribution circuit layer 620 and the redistribution circuit layer 640 are different; materials of dielectric layers between the redistribution circuit layer 620 and the redistribution circuit layer 640 are different; pitch between the redistribution circuit layer 620 and the redistribution circuit layer 640 are different. Namely, the unsymmetric substrate US may be in keeping with the one condition, two condition, three condition, or four condition as above.

For example, as shown in FIG. 6F, the redistribution circuit layer 620 includes four dielectric layer 622 and the redistribution circuit layer 640 includes two dielectric layer 642. Further, a thickness of the redistribution circuit layer 620 is greater than a thickness of the redistribution circuit layer 640, such that and the thickness of the first film 610 is greater than the thickness of the second film 630 correspondingly. In some embodiments, a thickness of each of the dielectric layers 622 is different from (such as smaller than) a thickness of each of the second dielectric layers 642.

In some embodiments, a thickness of the redistribution circuit layer 620 ranges between 10 microns and 100 microns, and a thickness of the redistribution circuit layer 640 ranges between 30 microns and 300 microns, but the disclosure is not limited thereto.

In some embodiments, a tapered direction of the vias 623 of the redistribution circuit layer 620 are opposite to a tapered direction of the vias 643 of the redistribution circuit layer 640. Further, the vias 623 of the redistribution circuit layer 620 are tapered toward a direction of the core layer 600 and the vias 643 of the redistribution circuit layer 640 are tapered toward a direction of the core layer 600, but the disclosure is not limited thereto.

It should be noted that, the detail in FIG. 6F is an exemplary embodiment, other configurations may be used. In application, the substrate US may be used for an RF Antenna in the package. (AiP) or the like.

In some embodiments, a pitch of the first redistribution circuit layer 620 is finer than a pitch of the second redistribution circuit layer 640, for example, a pitch of the redistribution circuit layer 620 is fine pitch and the redistribution circuit layer 640 is coarse pitch, but the disclosure is not limited thereto.

Figure 6G:
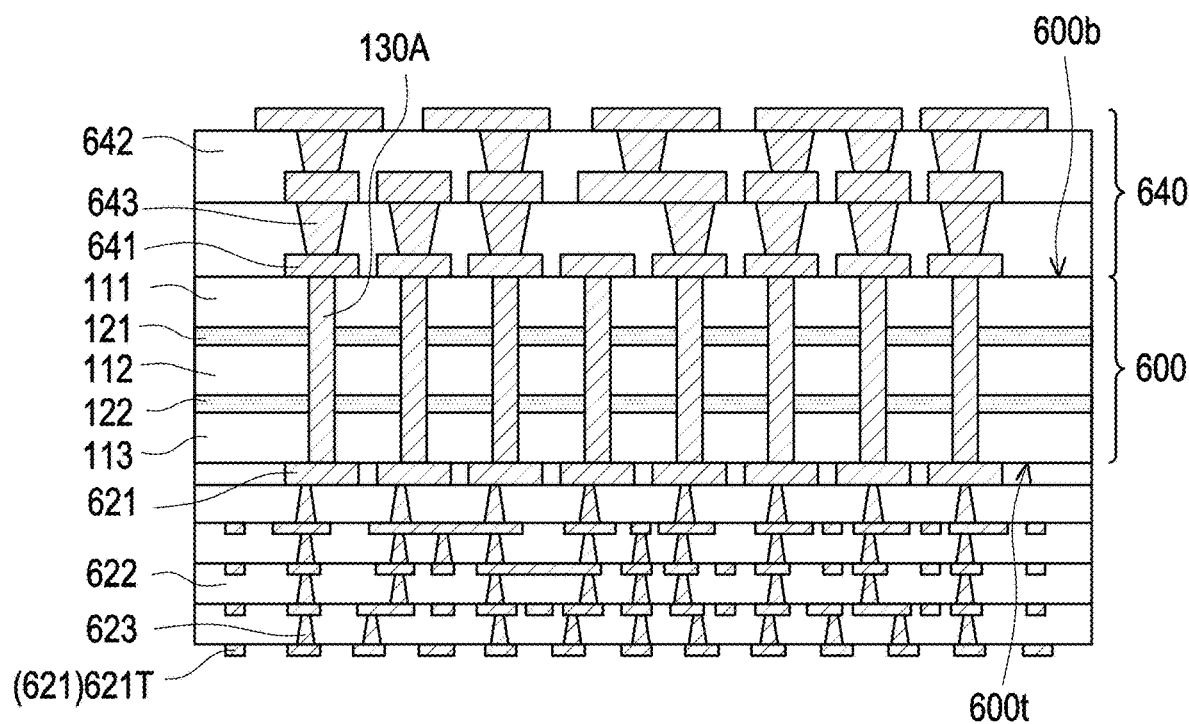
FIG. 6G is partially schematic cross-sectional views of a glass core substrate according to some embodiments of this disclosure.

Please refer to FIG. 6G, compared with the glass core substrate of FIG. 6F, the core layer 609 is configured by at least three glass layers, for example, similar to FIG. 3A, the core layer includes the glass layer 111, the glass layer 112, the glass layer 113, the bonding layer 121 the bonding layer 122, and the conductive connector 130A. Namely, the manufacturing method from FIG. 6A to FIG. 6F may be performed on the structure including the glass layer 111, the glass layer 112, the glass layer 113, the bonding layer 121 the bonding layer 122, and the conductive connector 130A.

Figure 6H:
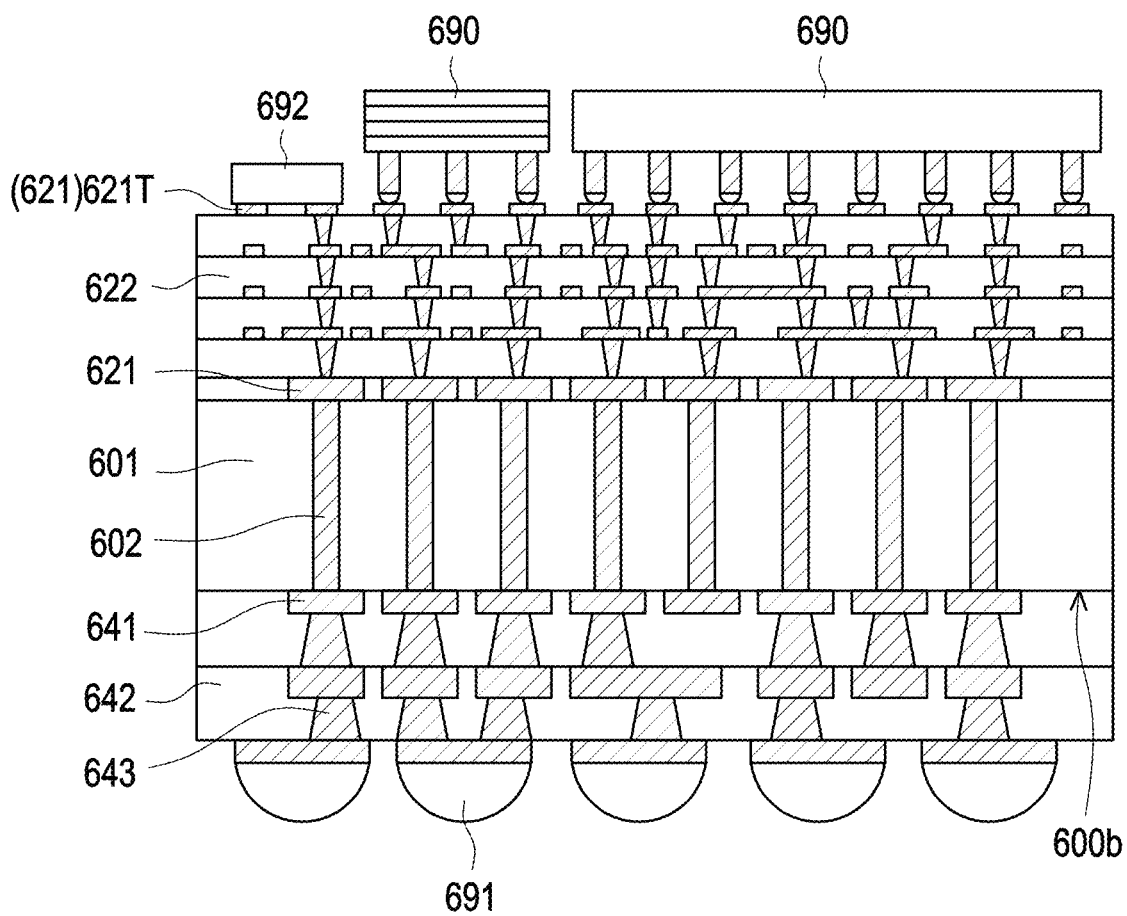
FIG. 6H are partial schematic cross-sectional views illustrating an electronic package including of a substrate of some embodiments of the disclosure.

Please refer to FIG. 6H. The electronic package may include a substrate of structure of FIG. 6F, a plurality of chips 690 (FIG. 6H schematically illustrates two chips 690, but it also may be more than two, such as three or four, etc.), and a plurality of external terminals 691, wherein the chips 690 and the external terminals 691 are disposed on the opposite surfaces of the substrate respectively, the pitch of the circuit in the circuit structure close to the chips 690 may be smaller than the pitch of the circuit in the circuit structure close to the external terminals 691, that is, the circuit structures of the substrate may include both a fine pitch and a coarse-pitch to fan out the signal of chips 690 to the external terminals 691, but the disclosure is not limited thereto.

In some embodiments, the chip 690 is, for example, logic chip, memory chip, three-dimensional integrated circuit (3DIC) chip (such as high bandwidth memory chip), XPU, I/O, CPO and/or the like, wherein the 3DIC chip includes multiple layers stacked on each other, and through silicon vias (TSVs) are formed to provide vertical electrical connections between the layers, but the disclosure is not limited thereto. In here, the chip 690 may be a small chip form (chiplet). In FIG. 6H, the electronic package further includes passive device 692 (such as capacitor or inductor).

In some embodiments, the external terminals 691 may be solder balls and may be formed using a ball placement process to be placed on the surface of the substrate away from the chips 690, and a soldering process and a reflow process may be optionally performed to enhance the adhesion between the external terminals 691 and the circuits on the surface of the substrate, but the disclosure is not limited thereto.

Figure 7:
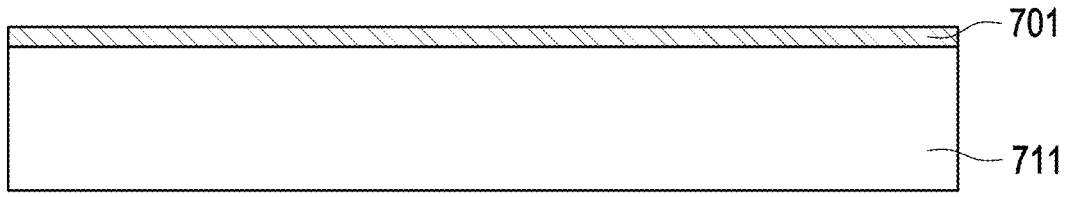
FIG. 7 to FIG. 12 are partially schematic cross-sectional views of a manufacturing method of a glass core substrate according to some embodiments of this disclosure.

Please refer to FIG. 7. First, a glass layer 711 is provided, wherein the glass layer 711 is similar to the glass layer 111 and the description of the same technical content is omitted. And then, in this embodiment, a laser stop layer 701 is formed on the entire glass layer 711, namely, a top surface of the glass layer 711 may be entirely covered by the laser stop layer 701.

In some embodiments, the method of forming the laser stop layer 701 is, for example, performing deposition on the glass layer 711 through chemical vapor deposition (CVD) or the like, but the disclosure is not limited thereto. In some embodiments, the material of the laser stop layer 701 may be metal, such as titanium (Ti) or chromium (Cr), but the disclosure is not limited thereto, the material of the laser stop layer 701 may be other material that can block laser in subsequent laser modification process.

Figure 8:
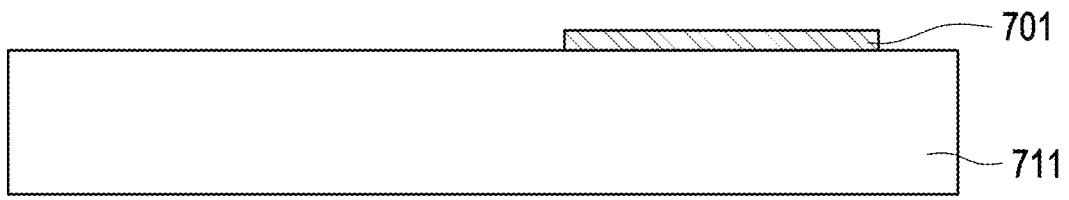

Please refer to FIG. 8. The laser stop layer 701 may be patterned by any suitable method. For example, a photolithography etching process may be performed to define the laser stop layer 701 matching the location of a cavity 704A in the glass layer 711 (as shown in FIG. 10).

Figure 9:
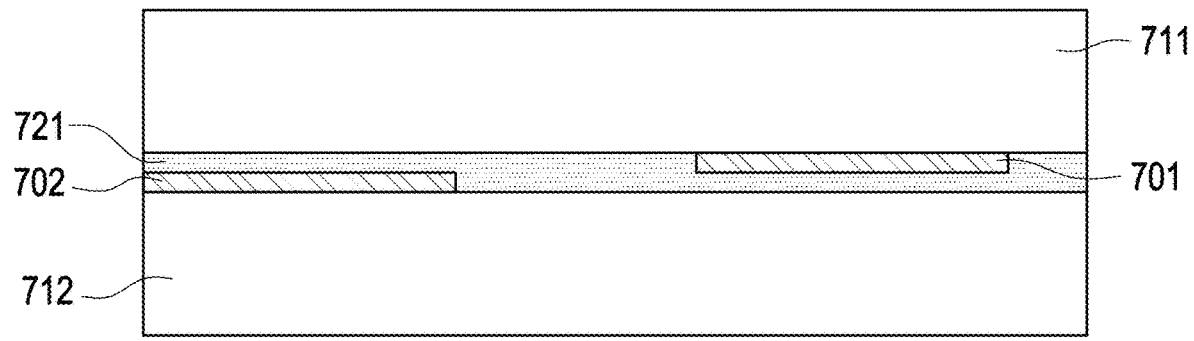

Please refer to FIG. 9. the steps from FIG. 7 to FIG. 8 are repeated to form another laser stop layer 702 on another glass layer 712, wherein the glass layer 712 is similar to the glass layer 112, the laser stop layer 702 is similar to the laser stop layer 701, and the description of the same technical content is omitted. Next, a flipping upside-down process is performed, for example, the glass layer 711 and the laser stop layer 701 formed thereon are flipping upside-down to face the glass layer 712 and the laser stop layer 702 formed thereon. In this embodiment, the laser stop layer 701 and the laser stop layer 702 are staggered, but the disclosure is not limited thereto.

After the flipping upside-down process, a bonding process is performed. For example, the glass layer 711 and the glass layer 712 may be bonded through a bonding layer 721, wherein the bonding layer 721 is similar to the bonding layer 121 and the description of the same technical content is omitted. In this embodiment, the laser stop layer 701 and the laser stop layer 702 are embedded in the bonding layer 721, namely, the laser stop layer 701 and the laser stop layer 602 are encapsulated in the bonding layer 721, but the disclosure is not limited thereto.

Figure 10:
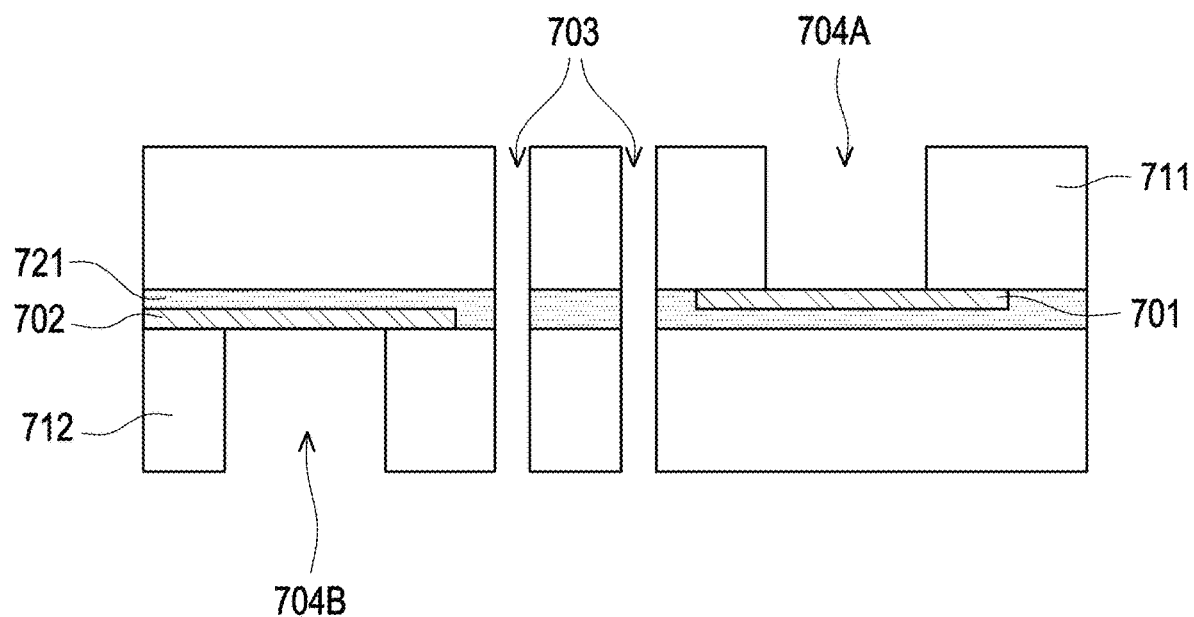

Please refer to FIG. 10, a plurality of through holes 703 penetrating through the glass layer 711, the bonding layer 721, and the second glass layer 712 may be formed. For example, similar to FIG. 1D to FIG. 1F, the through holes 703 may be formed by following steps (not shown). It should be noted that the embodiment in FIG. 1D to FIG. 1F is processed three stacked glass layers, and this embodiment is processed two stacked glass layers, therefore, the operation may be slightly different based on the number of glass layers.

For example, a laser modification process is optionally executed on the glass layer 711, the bonding layer 721, and the glass layer 712. Herein, a laser beam is applied to each of the layers to improve the etching ability of a laser passing region, thereby reducing the time and difficulty of the subsequent etching process. After executing the laser modification process, an etching process is executed on the laser passing region of the glass layer 711 and the glass layer 712 to form multiple openings, wherein the opening exposes the bonding layer 721. Next, an etching process is executed on the bonding layer 721 exposed by the openings, so that the openings continue to extend inward until the bonding layer 721 is totally removed and the through holes 603 may be formed, wherein the glass layer 711, the bonding layer 721, and the glass layer 712 are removed in multiple steps. Other details in FIG. 1D to FIG. 1F related to aforementioned features may be included in this embodiment and the description may be omitted. Also, in other embodiments, the glass layer 711, the bonding layer 721, and the glass layer 712 are removed in one step by suitable method.

Figure 12:
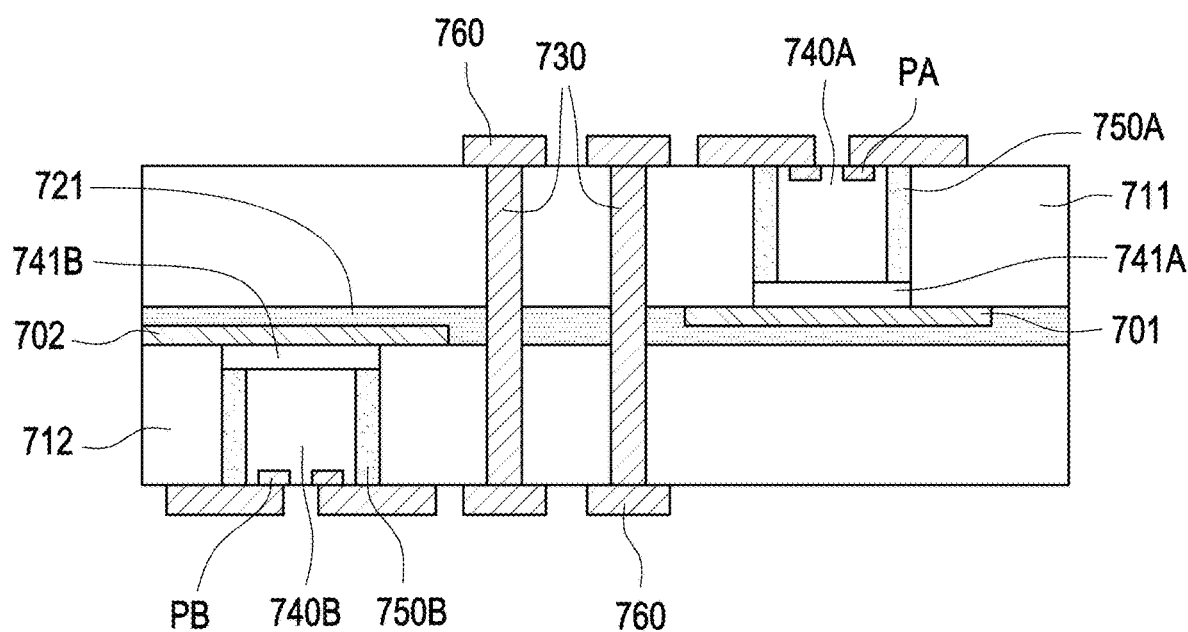

In FIG. 10, a cavity 704A is formed in the glass layer 711, and a cavity 704B is formed in the glass layer 712 by a laser modification process and a wet etching process. By doing so, the cavity 704A is stopped on the laser stop layer 701, and the cavity 704B is stopped on the laser stop layer 702, such that the laser stop layer 701 is used as a blocking structure to form the cavity 704A, the laser stop layer 702 is used as a blocking structure to form the cavity 704B, thus the size and thickness of the cavity 704A and the cavity 704B may be well controlled, and the electronic component 740A and the electronic component 740B (as shown in FIG. 12) may be accurately disposed at the desired location, thereby the greater integration with multi-functionality of the product may be satisfied.

In this embodiment, the through holes 703 are formed before forming the cavity 704A and the cavity 704B, but the disclosure is not limited thereto, alternatively, the through holes 703 are formed after forming the cavity 704A and the cavity 704B, or the through holes 703, the cavity 704A and the cavity 704B are formed simultaneously.

In some embodiments, the through holes 703 are located between the laser stop layer 701 and the laser stop layer 702, for example, the through holes 703 are located between the cavity 704A and the cavity 704B, but the disclosure is not limited thereto.

Figure 11:
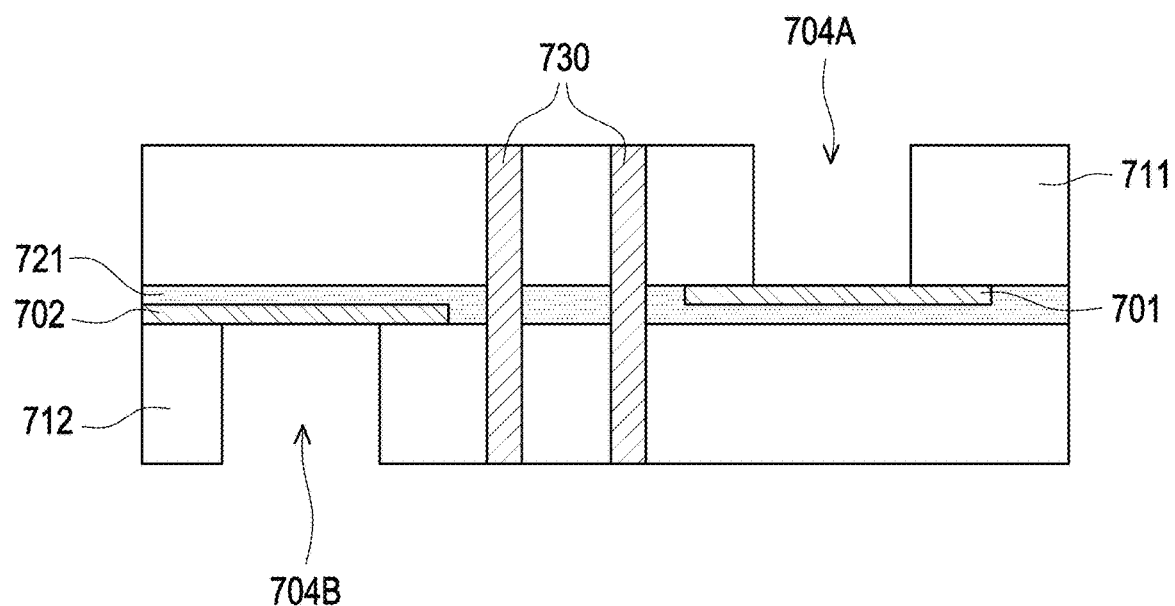

Please refer to FIG. 11, a plurality of conductive connectors 730 may be formed in the through holes 703 respectively, wherein the conductive connectors 730 may provide a vertical conductive path to the glass core substrate and may be called a "through glass via" (TGV). Accordingly, when a subsequent crack exists at the edge of the glass layer 711 and the glass layer 712, the crack encounters the obstruction of the bonding layer 721 during the process of the crack propagating toward the center of the substrate, so the bonding layer 721 may be regarded as crack-stopping structures. Herein, the conductive connectors 730 is similar to the conductive connectors 130 and the description of the same technical content is omitted.

Please refer to FIG. 12, an electronic component 740A is disposed in the cavity 704A, and an electronic component 740B is disposed in the cavity 704B, such that the electronic component 740A is embedded in the glass layer 711 and aligned with the laser stop layer 701, while the electronic component 740B is embedded in the glass layer 712 and aligned with the laser stop layer 702. For example, an orthographic projection of the electronic component 740A on the bonding layer 721 covers the laser stop layer 701, and an orthographic projection of the electronic component 740B on the bonding layer 721 covers the laser stop layer 702. Herein, the electronic component 740A and the electronic component 740B may include an active device or a passive device, wherein the active device may be a die or the like, the passive device may be a capacitor, an inductor, a resistor, or the like.

In some embodiments, the electronic component 704A is bonded to laser stop layer 701 by an adhesive layer 741A, and the electronic component 704B is bonded to laser stop layer 702 by an adhesive layer 741B, but the disclosure is not limited thereto, wherein the adhesive layer 741A and the adhesive layer 741B may be made of any suitable adhesive materials.

After disposing the electronic component 740A and the electronic component 740B, optionally, a filler 750A is filling in a space of the cavity 704A, and a filler 750B is filling in a space of the cavity 704B. Next, a planarization process is performed, such that a exposed surface of the electronic component 740A and a exposed surface of the filler 750A are coplanar, and a exposed surface of the electronic component 740B and a exposed surface of the filler 750B are coplanar. In some embodiments, the filler 750A and the filler 750B may be an ABF material or the like.

And then, for external connections, circuit layers 760 is formed on the glass layer 711 and the glass layer 712 respectively, wherein one circuit layer 760 may be in direct contact with the conductive connectors 730 and pads PA of the electronic component 740A, and another one circuit layer 760 may be in direct contact with the conductive connectors 730 and pads PB of the electronic component 740B, but the disclosure is not limited thereto. The manufacturing of a glass core substrate of the present embodiment may be generally completed through the manufacturing processes from FIG. 7 to FIG. 12.

It should be noted that, although in above embodiment has two laser stop layers, two cavities, and two electronic components, but the disclosure is not limited thereto, more or less laser stop layer, cavity, and electronic component may be formed and disposed, as long as the at least one electronic component may be disposed in one cavity and aligned one laser stop layer, the features belong to the protection scope of this disclosure.

Figure 13A:
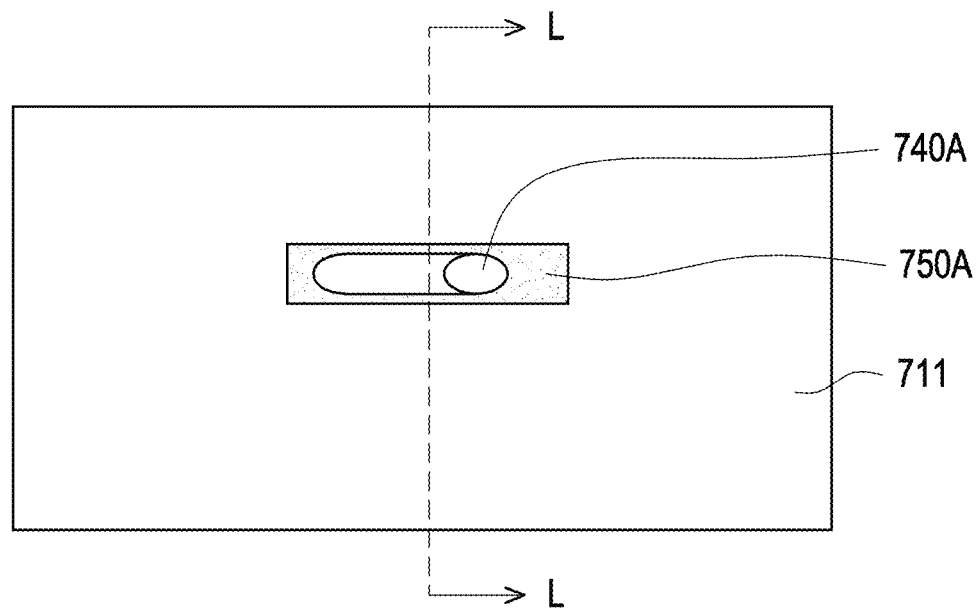
FIGS. 13A, 14A, 15A, 16A, and 17A are top views of the glass core substrate during various fabrication stages, according to some embodiments of this disclosure.
Figure 13B:
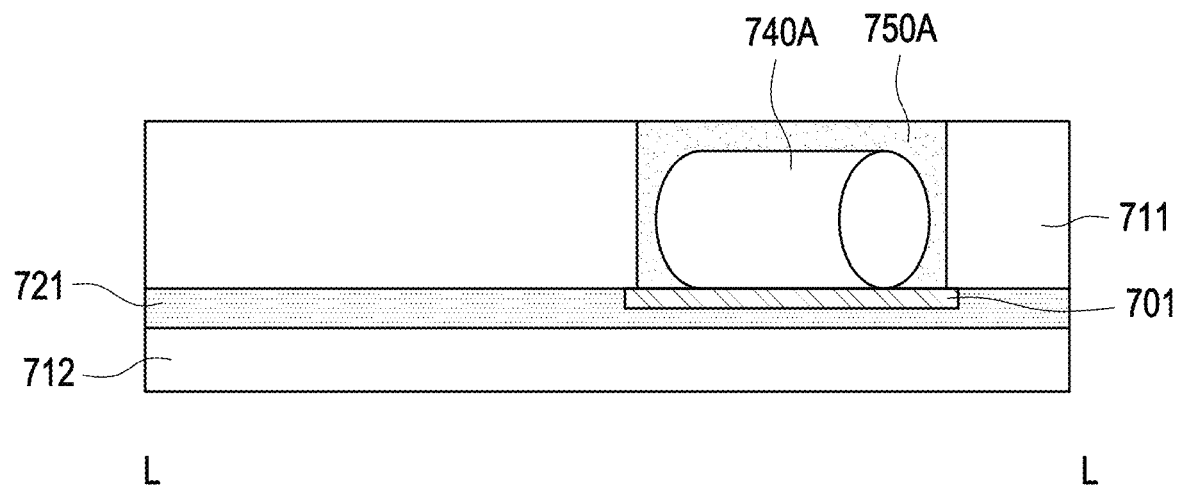
FIGS. 13B, 14B, 15B, 16B and 17B are sectional views of the glass core substrate of FIGS. 13A, 14A, 15A, 16A, and 17A, respectively, according to some embodiments of this disclosure.

Please refer to FIG. 13A and FIG. 13B, FIG. 13B is sectional view of FIG. 13A in L-L section line, and the laser stop layer is omitted in FIG. 13A for clarity. in this embodiment, similar to FIG. 12, the difference is the cavity only formed in the glass layer 711 and only the electronic component 740A and the filler 750A is implemented. In specific example, the electronic component 740A is the inductor, wherein the inductor may be a ferrite core, but the disclosure is not limited thereto.

Figure 14A:
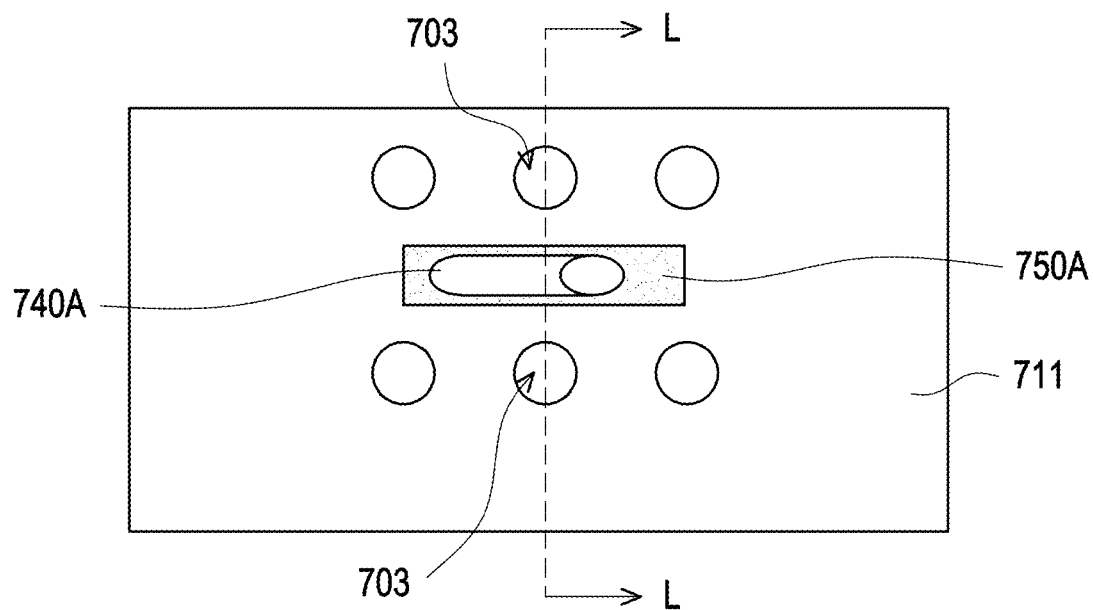
Figure 14B:
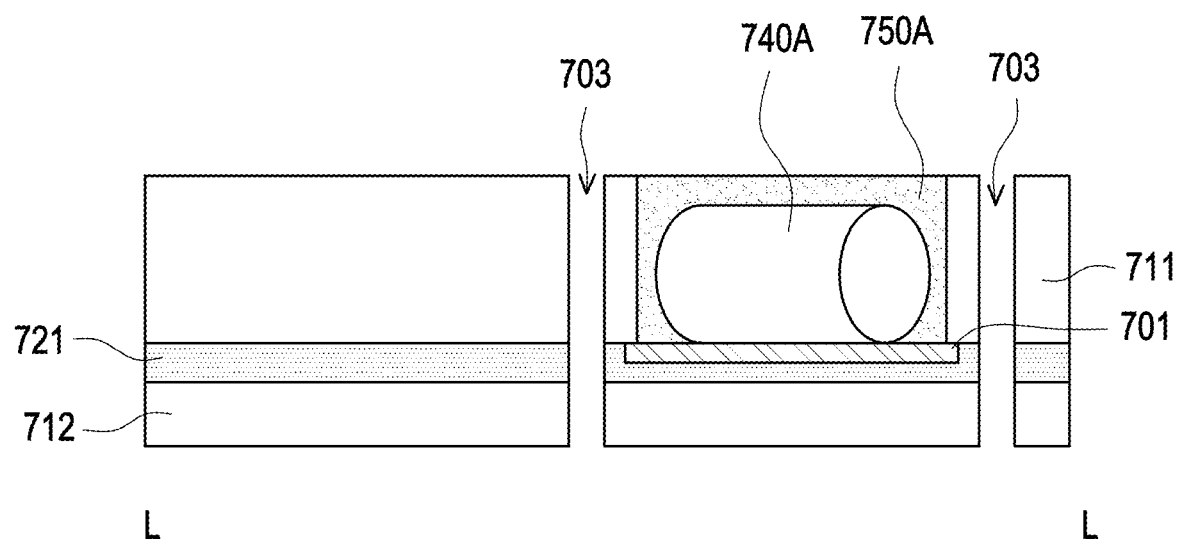
Figure 15A:
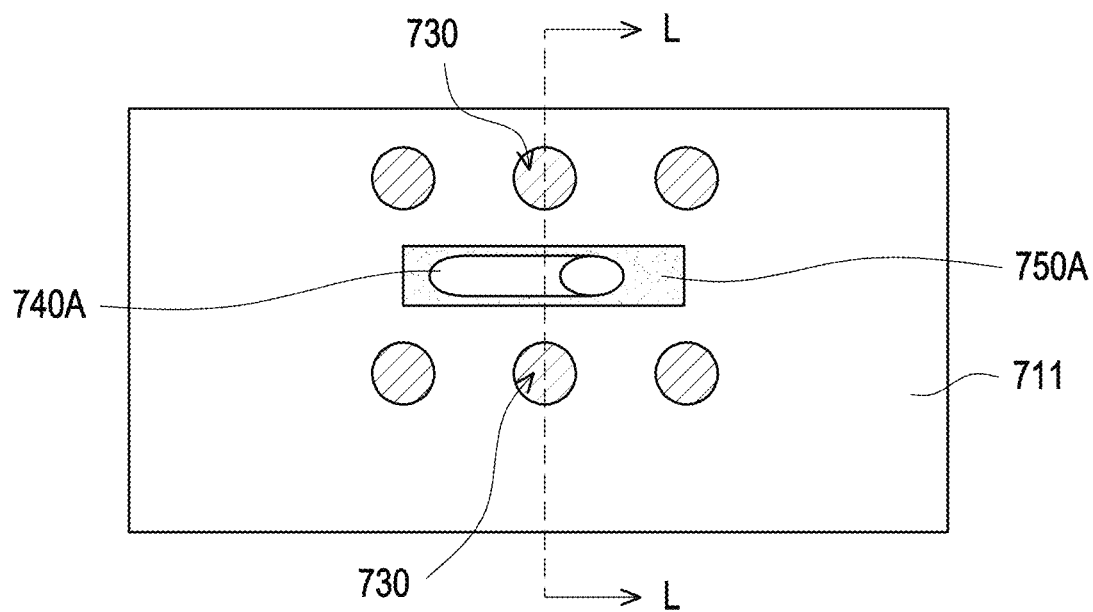
Figure 15B:
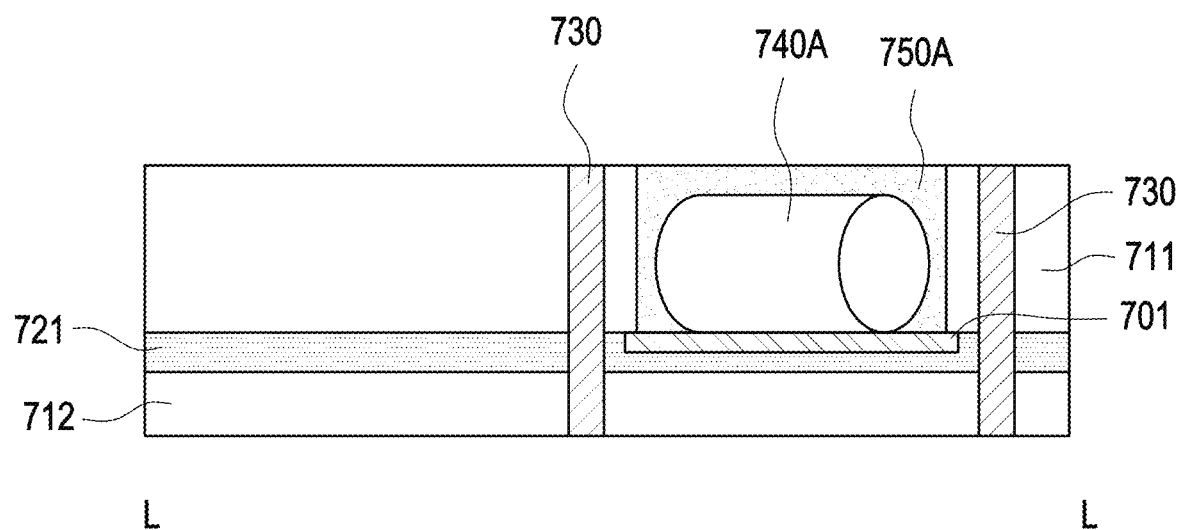

Please refer to FIG. 14A, FIG. 14B, FIG. 15A and FIG. 15B, FIG. 14B is sectional view of FIG. 14A in L-L section line, FIG. 15B is sectional view of FIG. 15A in L-L section line, and the laser stop layer is omitted in FIG. 14A and FIG. 15A for clarity. Similar to FIG. 10 to FIG. 11, the difference is the conductive the electronic component 740A is located between the two conductive connectors 730, in this way, the electronic component 740A is surrounded by the conductive connectors 730. In addition, in this embodiment, the conductive connectors 730 may be formed later than configuration of the electronic component 740A and the filler 750A, but the disclosure is not limited thereto.

Figure 16A:
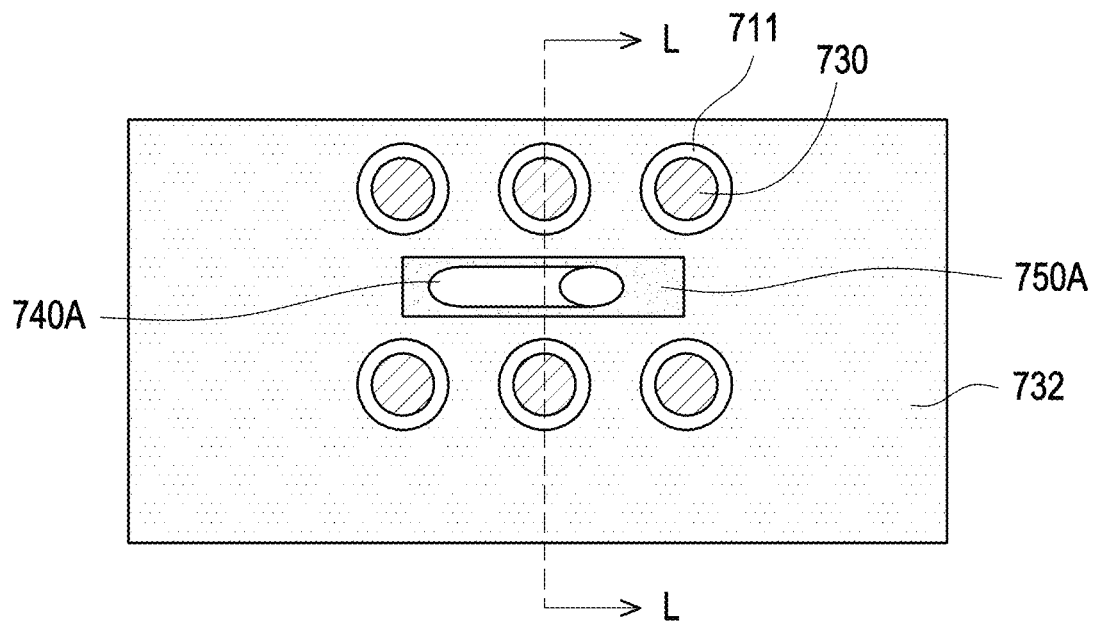
Figure 16B:
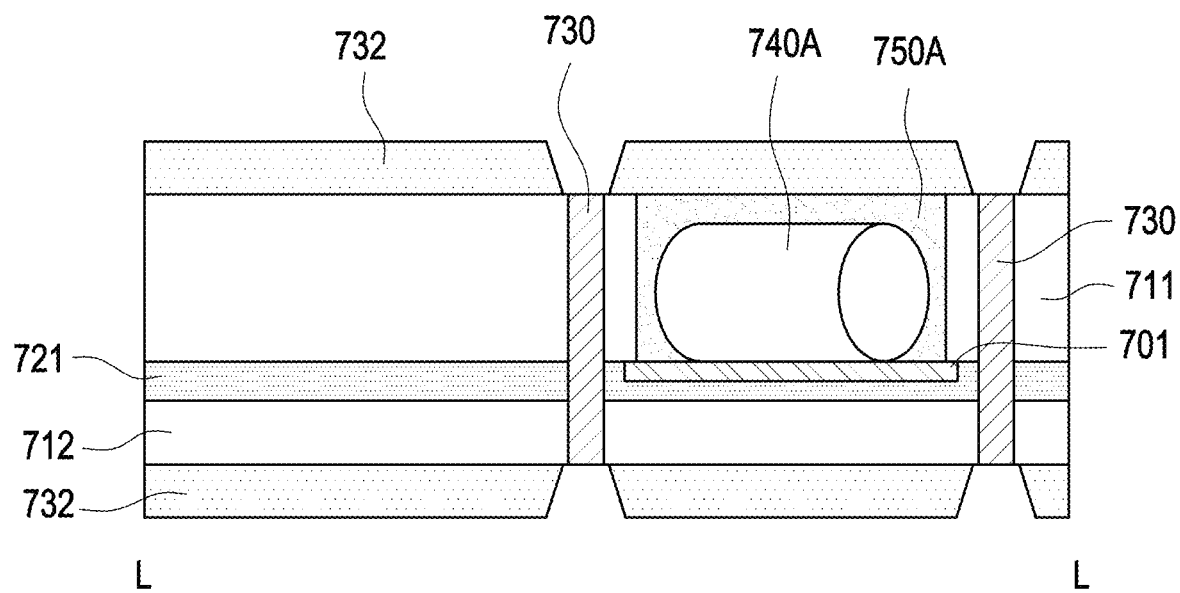

Please refer to FIG. 16A and FIG. 16B, FIG. 16B is sectional view of FIG. 16A in L-L section line, and the dielectric layer 732 above the electronic component 740A is omitted in FIG. 15A for clarity. After forming the conductive connectors 730, dielectric layers 732 including multiple openings (the openings are formed in an ABF material through laser drilling or the openings are formed in photosensitive polyimide (PSPI) through a photolithography etching process) are formed on the glass layer 711 and the glass layer 712, wherein the dielectric layer 732 is similar to the dielectric layers 332 and the description of the same technical content is omitted.

Figure 17A:
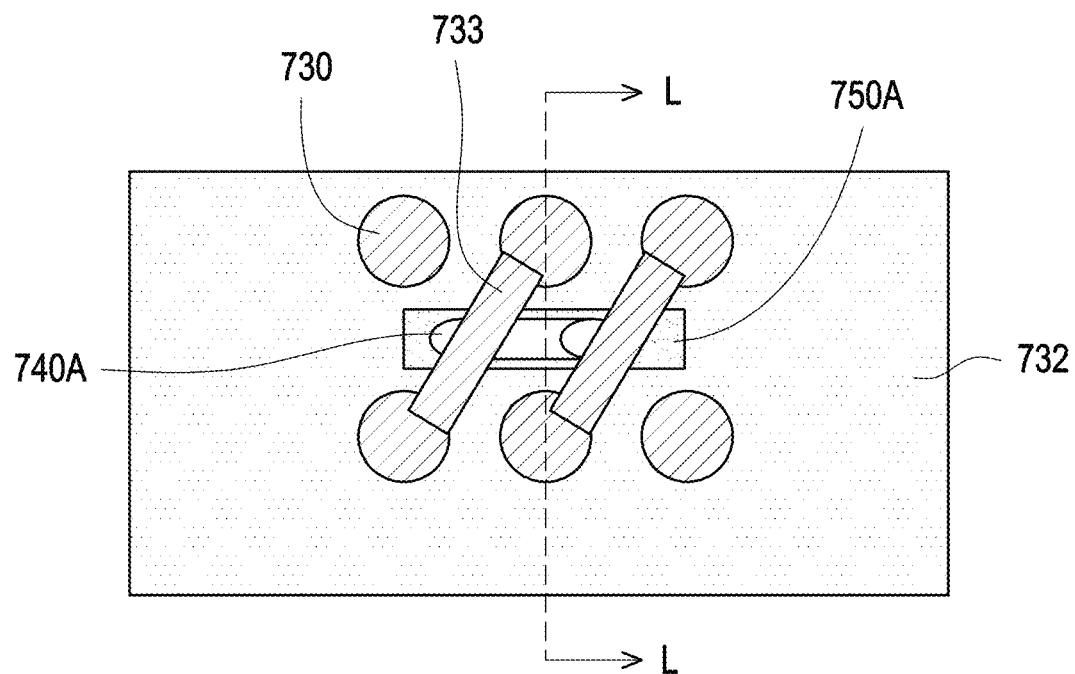
Figure 17B:
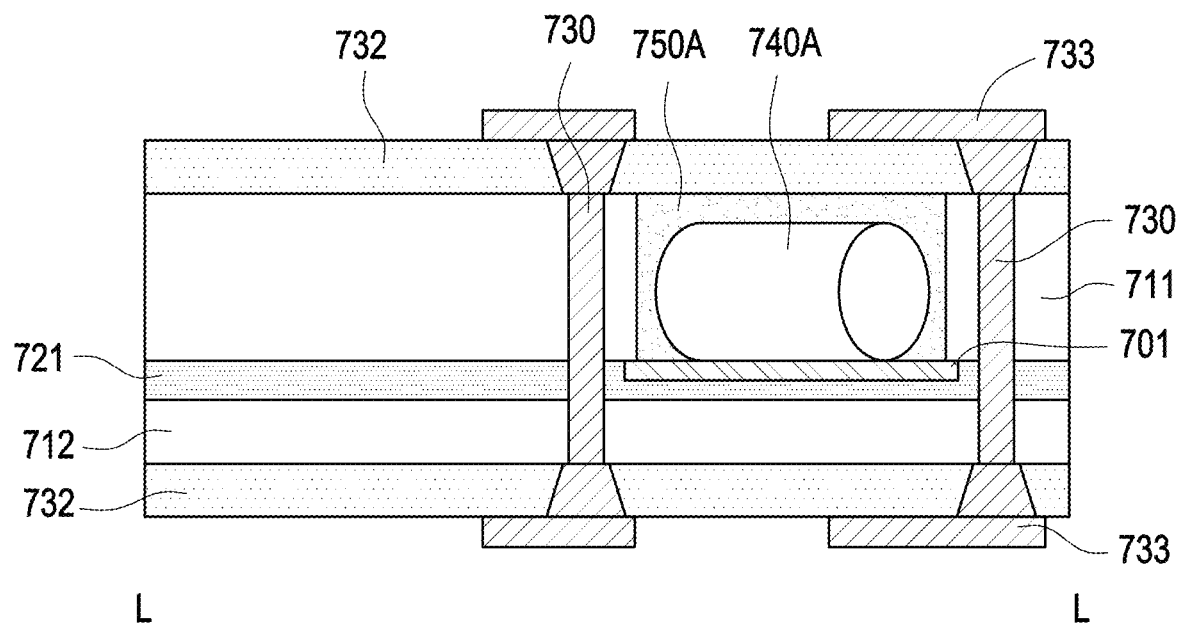

Please refer to FIG. 17A and FIG. 17B, FIG. 17B is sectional view of FIG. 17A in L-L section line, and the dielectric layers 732 above the electronic component 740A is omitted in FIG. 16A for clarity. At last, conductive layers 733 (with a material such as copper) may be formed in the openings of the dielectric layers 732 and extend to surface of the glass layer 711 and the glass layer 712, wherein the conductive layers 733 may be RDL.

In this embodiment, the conductive layers 733 and the conductive connectors 730 may be composed of a coil structure wrapping the electronic component 740A, namely, the coil structure surrounding the electronic component 740A (inductor). In this way, the coil structure is routing from the top dielectric layer 732 to the bottom dielectric layer 732 by suitable circuit design, and a portion of the coil structure extends diagonally above the inductor, therefore, performance of the inductor is increased, but the disclosure is not limited thereto. Herein, the conductive connectors 730 are part of the coil structure, however, in not shown embodiment, the conductive connectors 730 in FIG. 12 and the conductive connectors 730 in FIG. 17B may be all formed in the glass core substrate.

Figure 18:
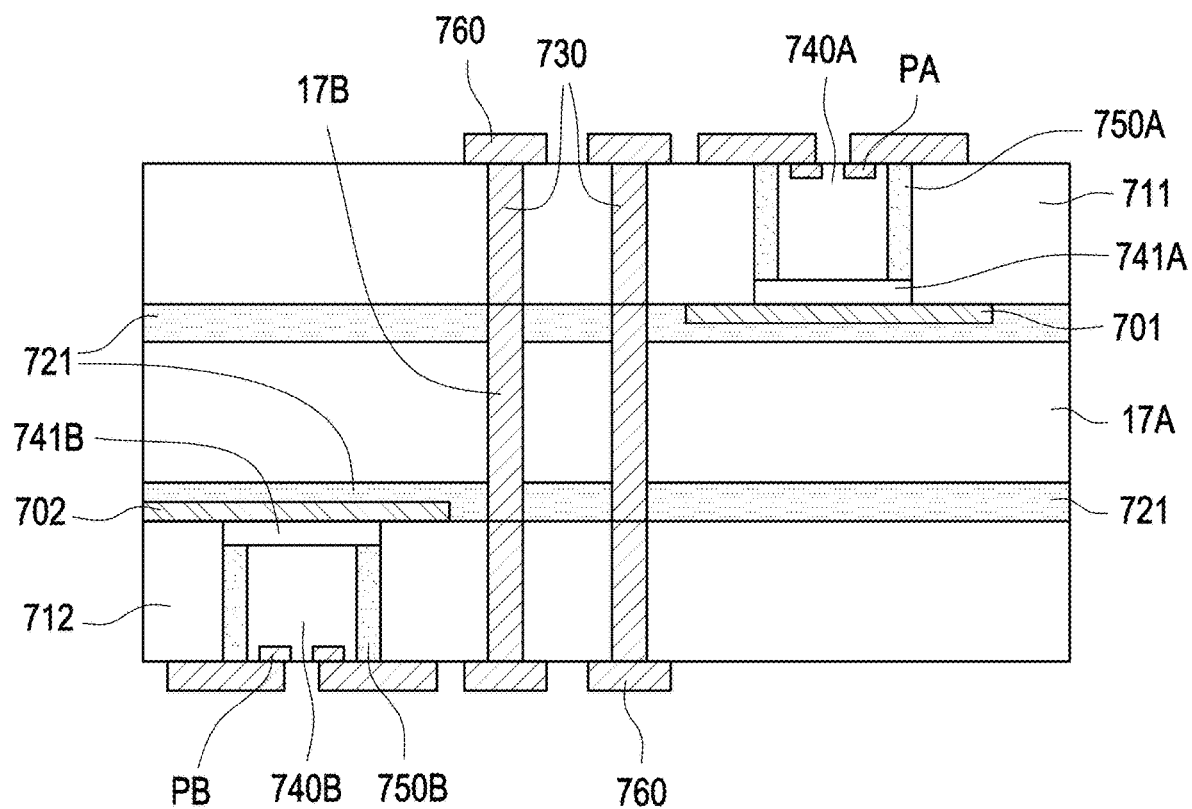
FIG. 18 is sectional views of the glass core substrate, according to some embodiments of this disclosure.

Please refer to FIG. 18, compared with the glass core substrate of FIG. 12, the laser stop layer 701, 702 are located in different bonding layer 721. In addition, the glass core substrate has glass layer 17A and conductive connectors 17B to interconnect two sides of the glass core substrate, wherein the glass layer 17A is similar to the glass layer 111, the conductive connectors 17B is similar to the conductive connectors 130, and the description of the same technical content is omitted. Herein the conductive connectors 17B may provide a vertical conductive path to the glass core substrate and may be called a "through glass via" (TGV).

To sum up, in this disclosure, the bonding layer is used as a crack-stopping structure through the design of the stacked glass layers (especially three glass layers). In this way, the phenomenon of rapid propagation of brittle cracks from the edge to the center of the substrate can be reduced, effectively inhibiting the propagation of cracks, thereby improving the reliability of a subsequent product.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A glass core substrate, comprising: a first glass layer; a second glass layer, disposed on the first glass layer; a third glass layer, disposed on the second glass layer; a first bonding layer, disposed between the first glass layer and the second glass layer; a second bonding layer, disposed between the second glass layer and the third glass layer; and a conductive connector, passing through the first glass layer, the first bonding layer, the second glass layer, the second bonding layer, and the third glass layer, wherein the conductive connector is configured to provide a vertical conductive path penetrating through the first glass layer, the first bonding layer, the second glass layer, the second bonding layer, and the third glass layer; the glass core substrate further comprising: a first redistribution circuit layer, a second redistribution circuit layer disposed on surfaces of the first glass layer and the third glass layer respectively, and a surface treatment layer disposed on the first redistribution circuit layer, wherein an outer layer of the first redistribution circuit layer has a first pitch, an outer layer of the second redistribution circuit layer has a second pitch, and, the first pitch is smaller than the second pitch.

2. The glass core substrate according to claim 1, wherein a coefficient of thermal expansion of the first glass layer is equal to a coefficient of thermal expansion of the third glass layer and a coefficient of thermal expansion of the second glass layer is greater than a coefficient of thermal expansion of the first glass layer.

3. The glass core substrate according to claim 1, a thickness of the first glass layer equal to a thickness of the third glass layer.

4. The glass core substrate according to claim 1, wherein tapered shape of vias in the first redistribution circuit layer and tapered shape of vias in the second redistribution circuit layer are opposite.

5. The glass core substrate according to claim 1, wherein a size of vias in the first redistribution circuit layer is gradually increases away from the first glass layer, and a size of vias in the second redistribution circuit layer is gradually increases in a direction away from the third glass layer.

6. The glass core substrate according to claim 1, wherein the first glass layer, the second glass layer and the third glass layer have the same pitch, and larger than the first pitch of the first redistribution circuit layer, and smaller than the second pitch of the second redistribution circuit layer.

7. A manufacturing method of a glass core substrate, comprising: providing a first glass layer, a second glass layer, and a third glass layer; performing bonding process to bond the first glass layer and the second glass layer through a first bonding layer and bond the second glass layer and the third glass layer through a second bonding layer; and removing portions of the first glass layer, the second glass layer, the third glass layer, the first bonding layer, and the second bonding layer to form an opening; forming conductive connectors penetrated through the first glass layer, the second glass layer, the third glass layer; and forming a first redistribution circuit layer and a second redistribution circuit layer on the first glass layer and the third glass layer respectively, wherein a pitch of the first redistribution circuit layer is smaller than a pitch of the second redistribution circuit layer, and the first redistribution circuit layer is configured to connect to the chips.

8. The manufacturing method of the glass core substrate according to claim 7, wherein three etching process steps are performed to remove portions of the first glass layer, the second glass layer, the third glass layer, the first bonding layer, and the second bonding layer.

9. The manufacturing method of the glass core substrate according to claim 8, wherein the first glass layer and the third glass layer are removed at first, then, the first bonding layer, the second bonding layer are removed, and the second glass layer is removed at last.

10. The manufacturing method of the glass core substrate according to claim 9, wherein after the bonding process, a laser modification process is performed on the first glass layer, and the third glass layer.

11. The manufacturing method of the glass core substrate according to claim 7, wherein forming conductive connectors further comprising: a conductive material is conformally formed on the surfaces of the glass layer and extends into the opening to form the conductive connectors.

12. The manufacturing method of the glass core substrate according to claim 7, wherein forming conductive connectors further comprising: the conductive material fills up the opening, wherein the conductive connector is provided a vertical conductive path of the substrate and the conductive connector is through glass via.

13. The manufacturing method of the glass core substrate according to claim 7, wherein after the etching process, a planarization process is performed.

14. The manufacturing method of the glass core substrate according to claim 7, wherein forming the first redistribution circuit layer and a second redistribution circuit layer further comprises: forming a first film on the third glass layer; forming the first redistribution circuit layer on the first layer with the first film; removing the first film; and forming a second redistribution circuit layer on the third layer to configure an unsymmetric substrate; and forming a surface treatment layer disposed on the first redistribution circuit layer.

15. The manufacturing method of the glass core substrate according to claim 14, wherein a material of the first film comprises organic film material, and a material of the second film comprises organic film material.

* * * * *